United States Patent [19]

Hamm

[11] 4,351,216

[45] Sep. 28, 1982

[54] ELECTRONIC PITCH DETECTION FOR MUSICAL INSTRUMENTS

[76] Inventor: Russell O. Hamm, 78 Horatio St., New York, N.Y. 10014

[21] Appl. No.: 68,689

[22] Filed: Aug. 22, 1979

[51] Int. Cl.$^3$ ........................ G10H 3/00; G01R 23/02

[52] U.S. Cl. ........................................ 84/1.15; 84/454; 84/DIG. 18; 324/77 A; 324/78 D

[58] Field of Search ...................... 84/1.14, 1.15, 1.16, 84/454, DIG. 18, DIG. 9, 1.01; 235/92 TF, 92 FQ; 324/77 A, 78 D; 179/1 SA, 1 SC, 1 A, 1 HF

[56] References Cited

U.S. PATENT DOCUMENTS

| | | | |
|---|---|---|---|
| 3,475,543 | 10/1969 | Burns | 84/1.15 |
| 3,539,701 | 11/1970 | Milde | 84/1.28 |
| 3,647,929 | 3/1972 | Milde, Jr. | 84/1.01 |
| 3,902,395 | 9/1975 | Avant | 84/1.16 |
| 3,911,776 | 10/1975 | Beigel | 84/DIG. 9 |
| 4,015,088 | 3/1977 | Dubnowski et al. | 179/1 SC |
| 4,052,568 | 10/1977 | Jankowski | 179/1 SA |
| 4,057,690 | 11/1977 | Vagliani et al. | 179/1 SC |
| 4,058,676 | 11/1977 | Wilkes et al. | 179/1 SA |
| 4,096,780 | 6/1978 | Dawson | 84/1.15 |
| 4,145,944 | 3/1979 | Helpinstill | 84/1.16 |
| 4,151,775 | 5/1979 | Merriman | 84/1.01 |
| 4,164,626 | 8/1979 | Fette | 179/1 SC |
| 4,195,544 | 4/1980 | Kolke | 84/1.19 |
| 4,217,808 | 8/1980 | Shepian | 324/77 A |
| 4,263,520 | 4/1981 | Kajihata et al. | 84/1.16 |
| 4,280,387 | 7/1981 | Moog | 84/DIG. 18 |

FOREIGN PATENT DOCUMENTS

| | | | |
|---|---|---|---|
| 1445855 | 8/1976 | United Kingdom | 84/454 |

OTHER PUBLICATIONS

Millman & Halkias, Integrated Electronics Analog and Digital Circuits and Systems, 1972, pp. 583, 585.

*Primary Examiner*—J. V. Truhe
*Assistant Examiner*—Forester W. Isen
*Attorney, Agent, or Firm*—Darby & Darby

[57] ABSTRACT

A pitch detecting system is provided for an electric guitar having an existing electromagnetic pick-up for strings. For the purposes of pitch detection, all the signals from the guitar strings are sensed by means of an auxiliary pickup comprising a substantially planar substrate of nonconductive material which is mounted upon the existing pickup, below the strings. A plurality of conductive coils on the substrate are each positioned in alignment with a different pole piece of the existing pick-up. The auxiliary pick-up provides a signal representing the sound of each string to a string separator, which transmits to its output only the signals from the auxiliary pick-up which has the fastest rate of build-up of its input signal. The single output signal from the string separator is provided to a pitch detector. In the pitch detector, a reference point in each cycle of the input signal (i.e. the signal from the string separator) is detected by determining when the input signal crosses in a positive direction through a threshold level corresponding to a predetermined proportion of the envelope of the input signal. The time interval between reference points in successive cycles of the input signal is then provided as an estimate of the period of the input signal when the duration is within a predetermined range of the existing estimate. This predetermined range is defined by two thresholds levels, each of which is a predetermined proportion of the existing period estimate. In a second embodiment, a single pitch detector simultaneously processes a plurality of input signals to provide a separate period estimate for each.

44 Claims, 12 Drawing Figures

ELECTRONIC PITCH DETECTION FOR MUSICAL INSTRUMENTS

This invention relates generally to electronic determination of the pitch of musical sound and, more specifically, concerns a method and apparatus for producing an electrical signal accurately representing the pitch of a musical sound in a form usable in an electronic music synthesizer, or the like.

Musical sounds, even those which are perceived as being a single note (i.e. as having a well defined pitch or frequency), are very rich in harmonic or related frequency content. Although such musical notes can be distinguished clearly in pitch by the human ear, when they are converted to electrical signals, their rich harmonic content results in a complex electrical signal in which the pitch, until this invention, could not be determined reliably or consistently.

Conventional methods of determining pitch involve either some form of phase (or frequency) locking or the measurement of the duration of a cycle of the sound. Both approaches require the detection and continual monitoring of a reference point having a fixed position in each cycle of the sound. Although conceptually simple, the detection of the reference point is substantially complicated by additional inherent characteristics of musical sound such as variations in attack (initial amplitude build-up) and release (amplitude decay) of each note (rather than having a constant amplitude) and even variations in the pitch and harmonic content of a note, depending upon how it is produced. Zero-crossings, often used as reference points in communications systems, are not reliable reference points to determine musical pitch, since the rich harmonic content produces zero-corssings not present in pure sinusoids having the respective pitch. For the same reason, and the additional complications introduced by attack and release, other points of predefined amplitude in a cycle are not effective reference points.

Once a reliable method is obtained for measuring the time interval between reference points in consecutive cycles, this information must be processed to rapidly produce a pitch (or period) estimate. The pitch estimate should be substantially unaffected by spurious sounds or electrical signals but must be sufficiently adaptable to provide rapid adjustment for actual changes in pitch of the musical sound, whether they are sharply attacked or relatively smooth. It is also important that the beginning and end of each note of the musical sound be clearly defined.

The acoustical characteristics of stringed musical instruments are among the most complex. Thus, accurate and reliable pitch detection for such instruments, for example for electric guitars, has long escaped resolution. The present invention was therefore directed, in specific terms, to providing a pitch detecting system for an electric guitar. However, those skilled in the art will appreciate that the invention is equally applicable to other types of instruments and to groups of instruments, which will generally have less stringent requirements.

In a pitch detector for an electric guitar, it is first necessary to extract the sound signal inherent in the vibrations of each string without interfering with the operation of the existing pickup providing the signal which is amplified to provide audible sound. Relative to the speeds at which electronic circuits operate, no two strings can be played exactly simultaneously. It is therefore possible to use a single pitch detecting portion for all strings and to connect it to each string as it is played. It then becomes necessary for the pitch detector to sense the string being played at any time, despite the fact that sensors for the adjacent strings may be partially actuated by the string being played. A similar problem would be faced, for example, if a single pitch detector were used for a group of instruments each playing into a different microphone. The pitch detector would lock on the output of that microphone for which the respective instrument was being played at any point in time. However, the sound picked up from that instrument by the other microphones would bring them into competition for the pitch detector and would interfere with the reception from the proper microphone.

It is an object of the present invention to detect accurately, consistently and reliably the pitch of notes produced by a musical instrument. It is contemplated that an electrical signal be provided representing this pitch, which signal would be in a form usable in an existing electronic music synthesizer.

It is another object of this invention to provide a method and apparatus for locating and monitoring a fixed reference point in each cycle of a signal representing a musical sound, so that the pitch of the sound may be determined by measuring the time interval between reference points in consecutive cycles of the signal.

It is yet another object of the present invention to provide a method of and apparatus for determining the pitch of a musical sound by estimating the periods thereof through continuous measurements of the time intervals between reference points in consecutive cycles of the sound, which method of and apparatus would rapidly yield an initial estimate of pitch and not change the estimate in the presence of spurious signals, yet would also change the pitch estimates quickly, in the event that actual changes in pitch of the musical sound occur, whether they are abrupt or gradual.

It is yet another object of the present invention to provide a method and apparatus for detecting the pitch of each note in a musical sound which also clearly defined the beginning and end of each note.

It is a further object of the present invention to share a single pitch detector among a plurality of sound sources and to provide a method and apparatus for determining which source is producing sound at any point in time, so that the pitch detector may be connected thereto.

It is a specific object of the present invention to provide a sensor producing a separate electrical signal representing the sound of each string of a stringed musical instrument having an existing pick-up thereon for audio, without appreciably affecting the normal operation of the instrument or the existing pick-up.

It is also an object of the present invention that the method and apparatus comprising it be directly useful with existing musical instruments with little or no modifications thereto.

In accordance with one aspect of the present invention, reference points for determining the period duration of a musical note are detected in an electrical signal representing the sound by sensing each crossing of the signal through a threshold level in a predefined direction. The threshold level is proportional to the envelope of the signal. This assures that the reference points in each cycle the signal are substantially independent of amplitude variations thereof and represent a substantially fixed point in each cycle.

In accordance with another aspect of the present invention, the period of an analog input signal representing a musical note is is estimated by updating an existing estimate to be equal to the period duration of the most recently received cycle if that duration lies in a range defined by two threshold levels, each of which is a different predetermined proportion of the existing period estimate. Spurious changes in pitch are avoided by requiring that a predetermined number of consecutive cycles must have measured period durations outside the predefined range before the period estimate is updated to indicate a new pitch. In order to obtain a rapid initial estimate when a true, abrupt change of pitch occurs, the period durations for the first few cycles following an abrupt change in pitch are accepted as consecutive estimates of the period.

In accordance with yet another aspect of the invention, a single pitch detector may be shared by a plurality of sound sources, each having a sensor dedicated thereto which provides an electrical signal representing the musical sound therefrom. The particular sensor being excited by a source at any time is selected as that one having the fastest build-up in amplitude. The signal from this sensor is transmitted to the pitch detector while the signals from the remaining sensors are blocked from transmission thereto.

In accordance with a first illustrative embodiment demonstrating objects and features of the present invention, a pitch detecting system is provided for an electric guitar having an existing electromagnetic pick-up for strings. For the purposes of pitch detection, all the signals from the guitar strings are sensed by means of an auxiliary pickup comprising a substantially planar substrate of nonconductive material which is mounted upon the existing pickup, below the strings. A plurality of conductive coils on the substrate are each positioned in alignment with a different pole piece of the existing pick-up. The auxiliary pick-up provides a signal representing the sound of each string to a string separator, which trasmits to its output only the signals from the auxiliary pick-up which has the fastest rate of build-up of its input signal. The single output signal from the string separator is provided to a pitch detector and a duration timer. In the pitch detector, a reference point in each cycle of the input signal (i.e. the signal from the string separator) is detected by determining when the input signal crosses in a positive direction through a threshold level corresponding to a predetermined proportion of the envelope of the input signal. The time interval between reference points in successive cycles of the input signal is then provided as an estimate of the period of the input signal when the duration is within a predetermined range of the existing estimate. This predetermined range is defined by two thresholds levels, each of which is a predetermined proportion of the existing period estimate. In the duration timer, the persistence of the detected pitch is estimated by indicating the beginning of the note when the envelope of the input signal crosses in a positive direction through a first threshold level, and indicating the termination of the note when the envelope of the input signal crosses through a second threshold level in a negative direction, the second threshold level being substantially lower than the first threshold level.

In a second embodiment in accordance with the present invention, a single pitch detector simultaneously processes a plurality of input signals to provide a separate period estimate for each period. The pitch detector is similar in operation to that of the first embodiment, except that the input signals are sampled on an interleaved basis and are repetitively, sequentially processed, so that the pitch detector is time shared among the plurality of input signals.

The foregoing brief description, as well as further objects, features and advantages of the present invention will best be understood from the following detailed description of presently preferred, but nonetheless illustrative, embodiments, with reference being had to the accompanying drawings wherein.

Figure 1:
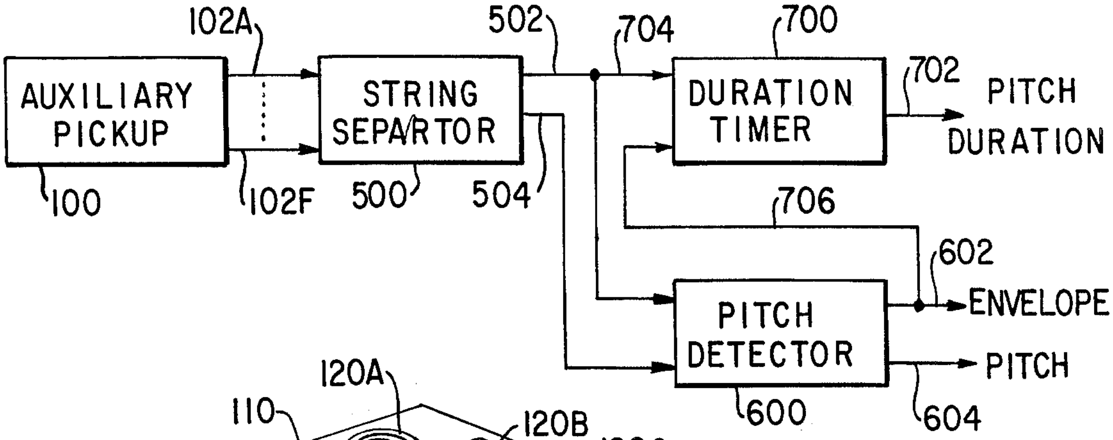
FIG. 1 is a functional block diagram of a pitch detecting system adapted for use with a stringed instrument having an existing, conventional electro-magnetic pick-up.

Referring now to the details of the drawing, FIG. 1 is a functional block diagram broadly illustrating an electronic encoder incorporating objects and features in the present invention. The illustrative encoder is designed for use in electric guitars having a conventional electromagnetic pick-up. However, it will be appreciated that this application is merely illustrative and that the invention may be applied to other instruments, as well as to groups of instruments. Regardless of what instrument or instruments the encoder is used with, it produces electrical signals capable of being used in an electronic music synthesizer of the type which is well-known today.

The illustrative encoder broadly comprises an auxiliary pick-up 100, a string separator 500, a pitch detector 600, and a duration timer 700. Auxiliary pick-up 100 mounts on the conventional electromagnetic pick-up of an electric guitar and, without affecting the operation of the conventional pick-up, produces on each of its output leads 102A–102F a signal corresponding to the vibration of a respective one of the strings of the guitar. In response to the signals provided by auxiliary pick-up 100, string separator 500 determines which string is being played at any particular instant of time and produces: on lead 502, an attack pulse corresponding to the initiation of the note (e.g. the initial striking of the corresponding string); and on lead 504, a signal representing the actual vibration of the particular string being played. In response to the signals produced by string separator 500, pitch detector 600 produces: on lead 602, a signal corresponding to the envelope of vibration of the string being played (i.e. the build-up and decay of the vibration are represented); and on lead 604, a signal representing the pitch (musical note) of the string being played. In response to the attack pulse signal from string separator 500 and the envelope signal from pitch detector 600, duration timer 700 produces a pitch duration signal on lead 702 which represents, by the logical 1 level in a binary waveform, the total duration of the instantaneous pitch on the string being played.

The specific embodiments of the invention described hereinafter will incorporate various conventional analog and digital circuit building blocks which are generally described below.

Six types of logic gates will be employed: inverters, AND gates, NAND gates, OR gates, NOR gates and EXCLUSIVE-OR gates. An inverter has a single input and a single output which is always the complement of the input (i.e., the output always assumes the opposite condition of the input). An AND gate has a plurality of inputs and has a single output which assumes a high or logical 1 condition when any of the inputs is high. A NOR gate is an OR gate with an inverted output. An EXCLUSIVE-OR gate has two inputs and an output which goes high only when one input (either one) goes high.

Three types of storage lelements are employed: D type flip-flops, R-S type flip-flops and storage registers. A D flip-flop has a D or data input, a C or clock input, a P or preset input, an R or reset input, and two complementary outputs Q and $\overline{Q}$. Upon the occurrence of a positive-going transisition at the clock input, the Q output assumes the condition that the signal at the D input had immediately prior to the positive going clock transition. The $\overline{Q}$ output assumes the opposite condition. An R-S flip-flop has R and S inputs and Q and $\overline{Q}$ outputs. Only one input may be high at any time: if it is the R input the flip-flop is RESET (Q goes low and $\overline{Q}$ goes high); if it is the S input the flip-flop is SET (Q goes high and $\overline{Q}$ goes low). If neither input is high both outputs remain unchanged. In a D flip-flop, the P input and R inputs override all other inputs and operate in the same manner as the S and R inputs, respectively, of an R-S flip-flop. A storage register consists of a plurality of D flip-flops connected in parallel to store a multi-bit word. The register has a single clock input C, a plurality of data inputs and a plurality of outputs.

A counter has a C or clock input, an R or reset input, and a plurality of output bits defining the count of the counter. With the R input low, the count of the counter is incremented on each positive going transition of the signal applied to the C input, so that the counter repetitively cycles from a zero count to its maximum count. When the R input is high, the counter is defined in terms of the number of stages or input bits it has. Thus, an N bit counter is capable of counting from 0 to $2^N$. A divide-by-P counter is a conventional counter which has a single output, incorporates logic to reset the counter after a count of P is reached, and produces a pulse at the output only when such a count is reached. In effect, the counter produces a pulse train having 1/P, the frequency of a pulse train applied as an input signal to it.

A multiplexer has a plurality of information inputs (analog or binary), a plurality of control or address inputs, and a single output. By design, there is a unique address and a single output. By design, there is a unique address or control word corresponding to each of the information inputs, and the occurrence of this word will cause the corresponding information signal to be transmitted to the output. A demultiplexer performs the inverse function of a multiplexer, accepting an input signal on a single input and transmitting it to that one of a plurality of output leads which corresponds to an applied address word.

A random access memory (RAM) has multi-bit data inputs and outputs and a multi-bit address word input, as well as W (write) and R (read) control inputs. The address word accesses a particular storage location within the memory in which it stores a word applied to the data word input when the W input is high. Also, when the R input is high, the contents of the addressed storage location are produced at the data output. When the R input is low, no signal is provided at the output of the memory.

A parallel adder performs the arithmetic addition of two multi-bit binary words, A and B, to produce a multi-bit binary output word of which the most significant bit is the carry output bit. In addition to the words A and B, a parallel adder also includes a binary carry in (input) bit.

A comparator is an analog circuit which receives analog reference input and information input signals and produces a logical 1 output when the information input signal exceeds the reference input signal and a logical 0 output otherwise.

A digital-to-analog converter is a circuit which receives a multi-bit binary input word and which, at its output, provides an analog voltage signal having an amplitude proportional to the magnitude of the binary input word.

A one-shot circuit or monostable multivibrator has a single input and complementary outputs indicated as Q and $\overline{Q}$. On the positive going transition of a pulse applied to the input, the one-shot produces a positive going pulse of predetermined duration at its Q output and a negative pulse of the same duration at its $\overline{Q}$ output.

An analog or bilateral gate has a control input and two output terminals. Depending on the amplitude of the voltage applied to the input, the output terminals are either shorted together or isolated.

Auxiliary Pick-up 100

Figure 2:
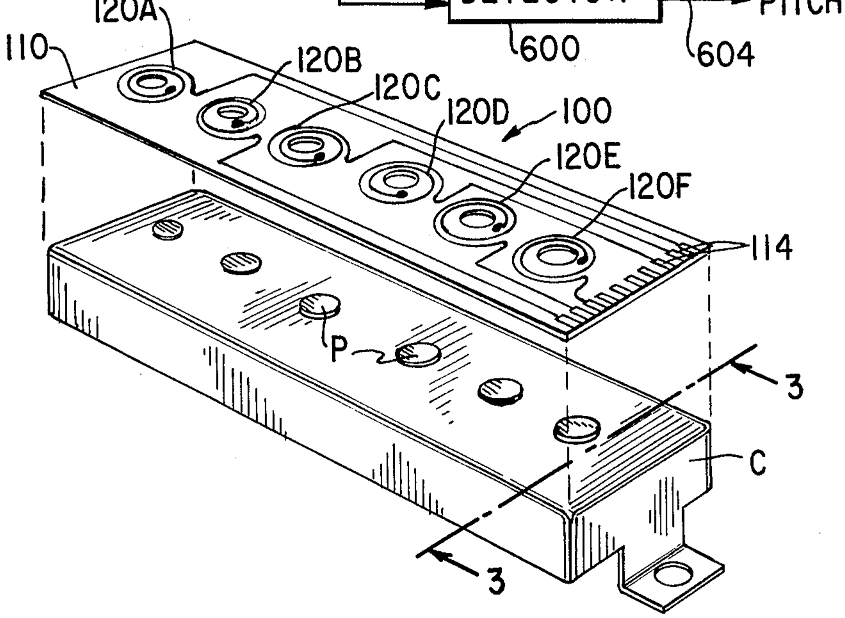
FIG. 2 is an exploded perspective view showing an auxiliary pick-up in accordance with the present invention in relationship to the existing electro-magnetic pick-up on which it is mounted.
Figure 3:
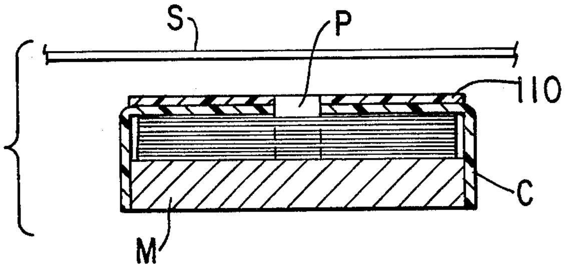
FIG. 3 is a sectional view along line 3—3 in FIG. 2.
Figure 4:
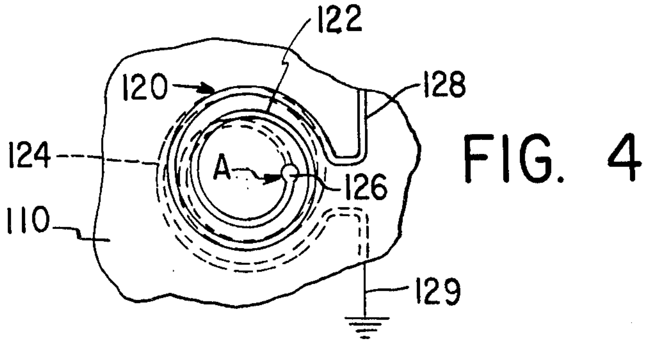
FIG. 4 is a fragmentary plan view of an auxiliary pick-up in accordance with the present invention, showing the details of one coil thereof.
Figure 5:
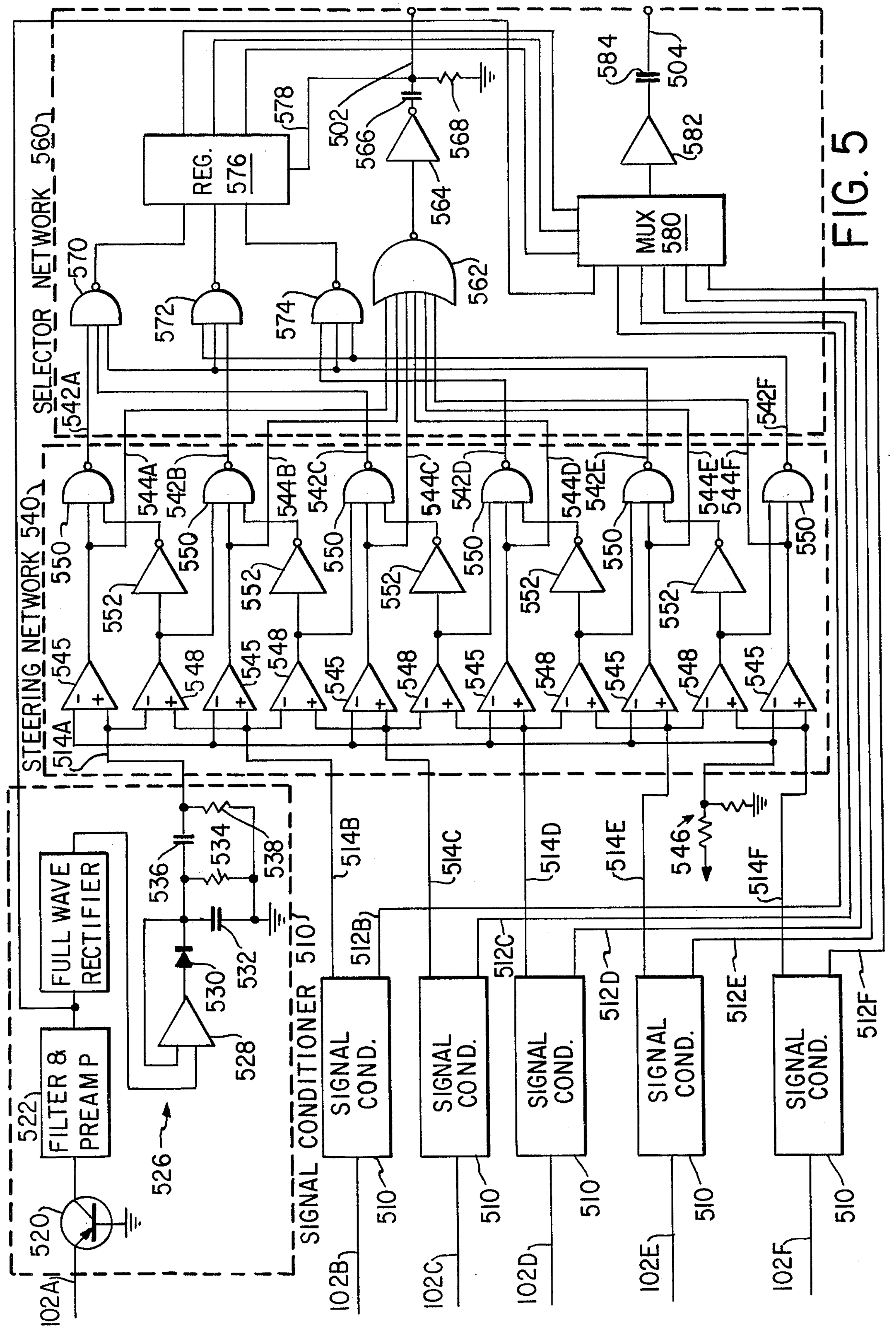
FIG. 5 is a logic schematic diagram illustrating the preferred form of the string separator in accordance with the present invention.

FIGS. 2–4 illustrate the detailed construction of auxiliary pick-up 100. The entire pick-up 100 is mounted on a non-conductive card or substrate 110, which is adapted to be secured on the cover C of a conventional electric guitar pick-up, for example, by means of double sided tape which is secured to the undersurface of card 110, or the like. On card 110, six coils 120A–120F are provided, each of which is positioned to be aligned with a different pole piece P of the conventional guitar pick-up. In the preferred embodiment, the card 110 is provided with a hole 112 at the center of each of cores 120A–120F into which the corresponding pole piece P extends when the card 110 is in its mounted position (see FIG. 3). However, it will be appreciated that auxiliay pick-up 100 will also operate if each coil thereon is merely aligned with a corresponding pole piece P (reminder: in the preceeding sentence refer to FIG. 3).

In the preferred embodiment, card 110 is made from a printed circuit card having a conductive layer on each surface and a plurality of conductive fingers 114 along one edge, to which a conventional edge connector may be secured for the purpose of obtaining signals from card 110. Inasmuch as coils 120A–120F are identical in construction, they will be described here in terms of a typical coil 120 shown in FIG. 4, the alphabetic suffixes being omitted in that figure. Coil 120 is comprised of the windings 122 and 124 which are printed, respectively, on the upper and under surfaces of the card 110. Each winding 122, 124 is helical and includes two turns, and the two windings 122, 124 are conductively connected at their innermost ends (at 126) to form one continuous, four-turn coil which spirals in towards its center on one surface and out on the other. The outermost end of winding 122 is joined by means of a conductor 128 to a corresponding one of fingers 114 and the outermost end of winding 124 is connected to a ground bus 129, which also terminates on a corresponding one of fingers 114. When a conventional connector is mounted to the edge of card 110 which includes the fingers 114, the conductors of the harness thereof serve the function of leds 102A–102F of FIG. 1.

As can be seen in FIG. 3, with the card 110 in its mounted position, each coil, for example coil 120F, is disposed about and circumscribes the respective pole piece P and is spaced below the corresponding string S. The pole piece has a magnetic field eminating therefrom a portion of flux lines of which extend through the winding 120F to the string S and then return to the magnet M. When the string S vibrates, the magnetic field extending through coil 120F is disturbed and caused to vary. The varying magnetic field then induces a varying current signal in coil 120F, which signal is related to the vibration of string S. It is thus induced current in each of coils 120A–120F that is provided as an output signal on leads 102A–102F, respectively.

String Separator 500

String separator 500 broadly comprises a plurality of identical signal conditioners 510, a steering network 540, and a selector network 560. Each of signal conditioners 510 receives the induced current signal from one of leads 120A–102F of pick-up 100. From these current signals, each signal conditioner produces a voltage signal proportional to the current signal (on leads 512A–514F) and a signal proportional to the envelope (the build-up and decay) of the vibration of the corresponding string (on leads 514A–514F). In response to the signals on leads 514A–514F, steering network 540 produces: on the corresponding one of leads 542A–542F, a negative going pulse on the lead corresponding to the string being played and a logical-one or high level on the lead corresponding to each other string; and on strings 544A–544F, a pulse which remains at a high level for the duration of the interval during which the envelope of the corresponding string remains above a predetermined threshold level. Selector network 560 operates on the signals produced on leads 544A–544F to produce an attack pulse on lead 502 having a positive going transition at the instant that the envelope of the string being played crosses the predetermined threshold level. Under control of the signals produced on leads 542A–542F, selector network 560 also operates on the signals produced on leads 512A–512F to transmit to lead 504 only the signal on that one of leads 512A–512F which corresponds to the string being played.

In each signal conditioner 510, the current signal from the corresponding one of leads 102A–102F is initially applied to a current amplifier, shown diagramatically as a common base transistor amplifier 520 (biasing and similar network components have been omitted). The amplified current signal is then applied to a filter and preamp network 522 which includes a conventional low pass filter and a preamplifier. This produces a voltage signal in which undesirable high frequency fluctuations have been eliminated. This voltage signal is applied to the corresponding one of leads 512A–512F and, therethrough, to a conventional full wave rectifier 524, then to a peak detector network 526 comprising an operation amplifier 528, a diode 530, a capacitor 532 and a resistor 534. The amplifier 528 operates as a unity gain of buffer amplifier and the diode 530 capacitor 532 and resistor 534 cooperate to produce across capacitor 532 the peak voltage in each peak of the full wave rectifier signal. Thus, the signal across capacitor 532 corresponds to the envelope of the signal applied to the full wave rectifier 524. Capacitor 536 and resistor 538 cooperate to form a conventional differentiating network, so that the signal appearing across resistor 538 is the derivative of the envelope and is, therefore, proportional to the slope of the envelope. The voltage signals appearing on leads 514A–514F therefore correspond to the slopes of the corresponding envelopes.

Steering network 540 includes a plurality of comparators 545, each of which receives a corresponding one of the signals on leads 514A–514F at its positive input. On its negative input, each of comparators 545 receives a reference voltage produced by means of a resistor divider network 546 connected between the positive voltage source and ground. This reference voltage corresponds to a threshold value of envelope slope. In addition, a plurality of bridging comparators 548 are each dedicated to an adjacent pair of comparators 545 and each has its negative input connected to the positive input of the higher of these comparators 545 and its positive input connected to the lower of these comparators 545. The output of each comparator 545 is provided on the corresponding one of leads 544A–544F and is also provided as an input to a corresponding one of NAND gates 550. The output of each of comparators 548 is provided directly to the next lower one of NAND gates 550 and through an inverter 552 to the next higher of NAND gates 550. The output of each of NAND gates 550 is provided on a corresponding one of leads 542A–542F.

In operation, the signal on one of leads 514A–514F will exceed the threshold level when the corresponding envelope is building up faster than the predefined threshold valve. Even when the strings of a guitar are strummed, they are, in effect, played only one at a time. Thus, the signal on only one of leads 514A–514F would exceed the referenced voltage at any point in time. This would cause the corresponding one of comparators 545 to produce a logical one level at its output for the duration of the time that its input signal exceeds the threshold voltage. Inasmuch as none of the other of comparators 545 would have an input signal as high as that of the comparator producing in the logical one output, the comparator 548 immediately above that comparator 545 produces a logical one at its output and the comparator 548 immediately below that comparator 545 produces a logical zero output. As a result, NAND gate 550 corresponding to comparator 545 which has the logical one output has three logical one inputs and produces a logical zero output, and the NAND gates 550 immediately above and below that NAND gate produce logical one outputs. The NAND gate 550 with the logical zero output will continue to produce that output as long as its corresponding to comparator 545 produces a logical one output (i.e. as long as the corresponding envelope rate of change remains above the threshold level).

A primary purpose of steering network 540 is not immediately apparent from the preceeding discussion. Inasmuch as the coils 120A–120F of auxiliary pick-up 100 are in close proximity, it has been found that, when a particular string is played, not only is the corresponding one of coils 120A–120F energized, but so are the two immediately adjacent ones. Furthermore, the currents induced in the adjacent coils may have a substantial amplitude. Thus, the signals on adjacent strings are of sufficient amplitude to be mistaken for that of the string being played and to interfere with the reception of the signal of the string being played. This interferences is referred to as cross talk. Although the cross talk may have a substantial amplitude, it has been found that its envelope builds up substantially more slowly than that of the string being played. Since the signals on leads 514A–514F correspond to the rate of change of each envelope, the string being played would cross the threshold level sooner and, during the build-up of the envelope, would continue to be at a substantially higher level than the envelopes of the adjacent strings.

Based on the preceeding discussion, it will be appreciated that the string being played would produce a logical zero output at the corresponding one of NAND gates 550 and that as a result of the action of the two adjacent comparators 548, the NAND gates 550 immediately above and below would produce logical one outputs. As will be explained below, this cause selector networks 560 to produce, on leads 504, the voltage signal corresponding to the string being played. A primary function of steering network 540 is the elimination of cross talk from adjacent strings.

In selector network 560, the signals on leads 549A–549F are provided as inputs to a NOR gate 562, the output of which will go low as soon as one of the inputs thereto goes high. Thus, the output of NOR gate 562 goes low as soon as the envelope on the string being played builds up at a rate exceeding the threshold level. The output of NOR gate 562 is applied through an inverter 564 to a differentiating network comprising capacitor 566 and resistor 568. The signal across resistor 568 is applied to lead 502. The signals appearing on leads 542A–542F are applied, in selector network 560, to NAND gates 570, 572 and 574, which cooperate to define a one-out-of-six to three bit binary encoder. The output signals of NAND gates 570, 572 and 574 are applied as input data to register 576 which is clocked with the signal on the 502 via lead 578. The three outputs of register 576 are applied as control inputs to a multiplexer 580, receiving as its six input data signals the voltage signals on leads 512A–512F, which correspond to the currents sensed by the coils of auxiliary pick-up 100. The output of multiplexer 580 is applied through a buffer amplifier 582 and an AC coupling capacitor 584 to lead 504.

In operation, the inputs to NOR gate 562 go high as the corresponding envelope builds up at a rate exceeding the threshold level. Inasmuch as the envelope of the string being played builds up at the fastest rate, the input to NOR gate 562 corresponding thereto goes high first, causing the output of NOR gate 562 to go low. Through the action of inverter 564, this causes the differentiating network comprising capacitor 566 and resistor 568 to produce a positive pulse on lead 502. Via lead 578, this pulse causes register 576 to be clocked. While the envelope on the string being played builds up at a rate exceeding the threshold level, that one of leads 542A–542F corresponding to the string being played will be low and all others of leads 542A–542F will be high. NAND gates 570, 572 and 574 produce a three bid binary word identifying the input which is low and this word is stored in register 576 when the pulse is produced on lead 502. The word stored in register 576 controls multiplexer 580 so that the corresponding voltage signal (i.e. the signal on the corresponding one of leads 512A–512F) is transmitted through the multiplexer, amplifier 582 and capacitor 584 to lead 504. Thus, selector network 560 produces an attack pulse on lead 502 at the instant that the build up of the envelope on the string being played exceeds the threshold level and, thereafter, produces on lead 504 the voltage signal representing the vibrations of that string.

From the description relating to string separator 500, it will be appreciated that the present invention contemplates distinguishing the signal provided by the coil of a played string from that provided by the coil of adjacent strings by comparing the rates at which the envelopes of the respective strings build-up. Specifically, the method utilized in the preferred embodiment to identify the voltage signal from the string being played comprises the steps of:

(a) generating a signal corresponding to the rate of build-up of the envelope of vibration of each string;
(b) detecting when each envelope begins building up at a rate exceeding a predefined threshold level;
(c) transmitting to an output terminal the voltage signal for which the envelope build up rate first exceeds the threshold level; and
(d) simultaneously disabling transmission to the output terminal the voltage signal for the strings adjacent to the one for which the signal is transmitted.

Pitch Detector 600

Figure 6:
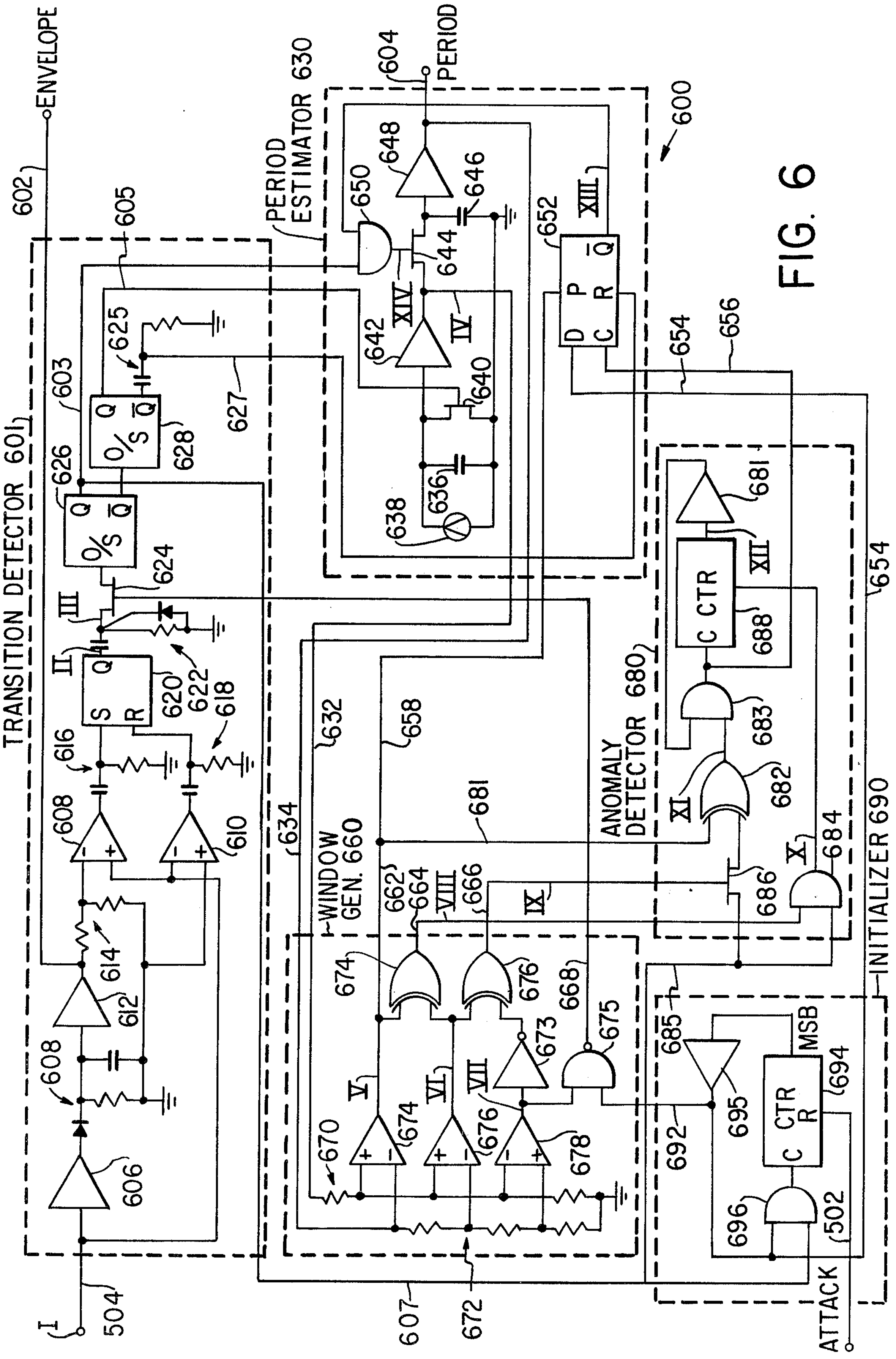
FIG. 6 is a logic schematic diagram illustrating a first preferred embodiment of a pitch detector in accordance with the present invention.
Figure 7:
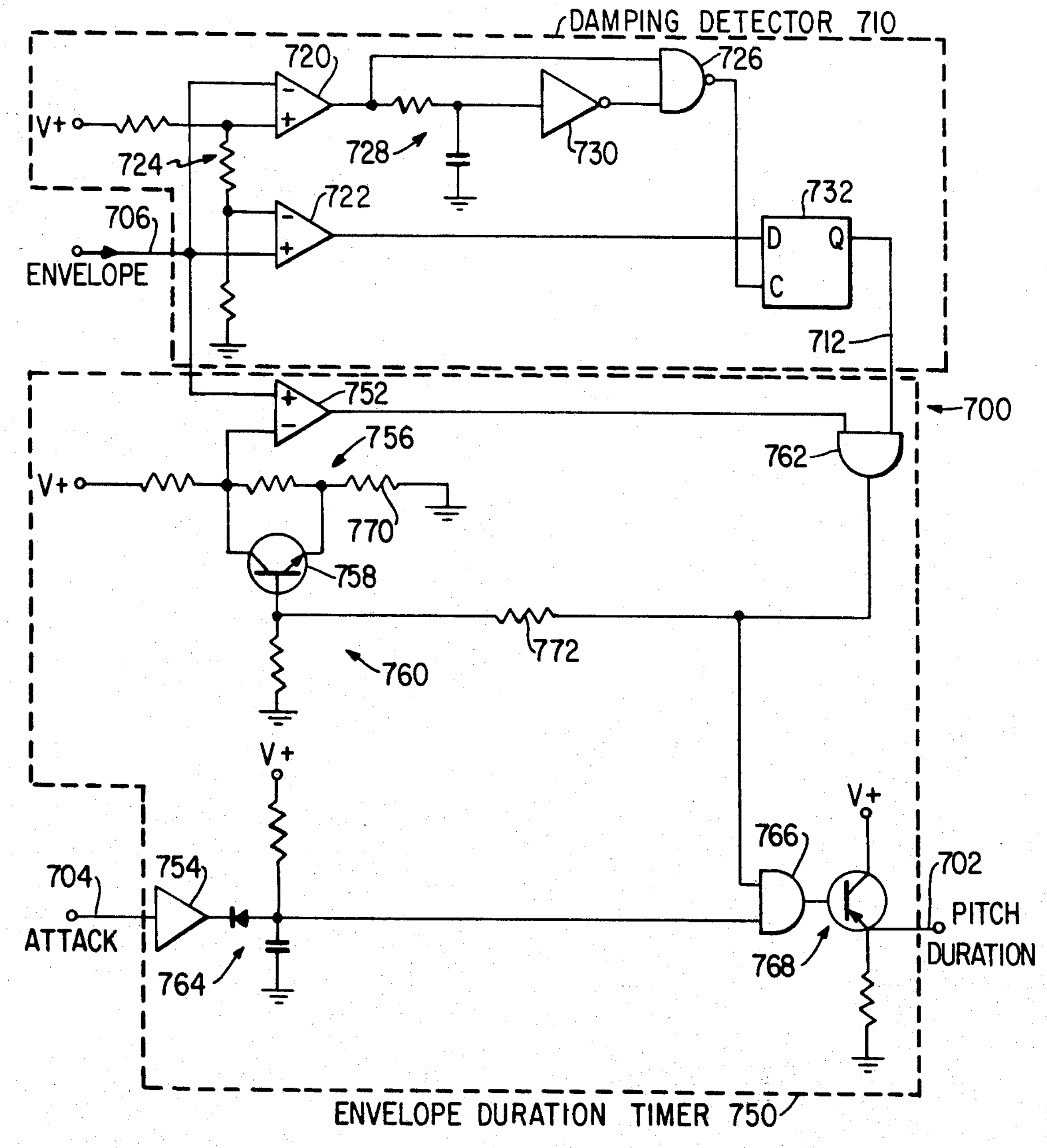
FIG. 7 is a logic schematic diagram of a preferred form of a duration timer in accordance with the present invention.
Figure 8:
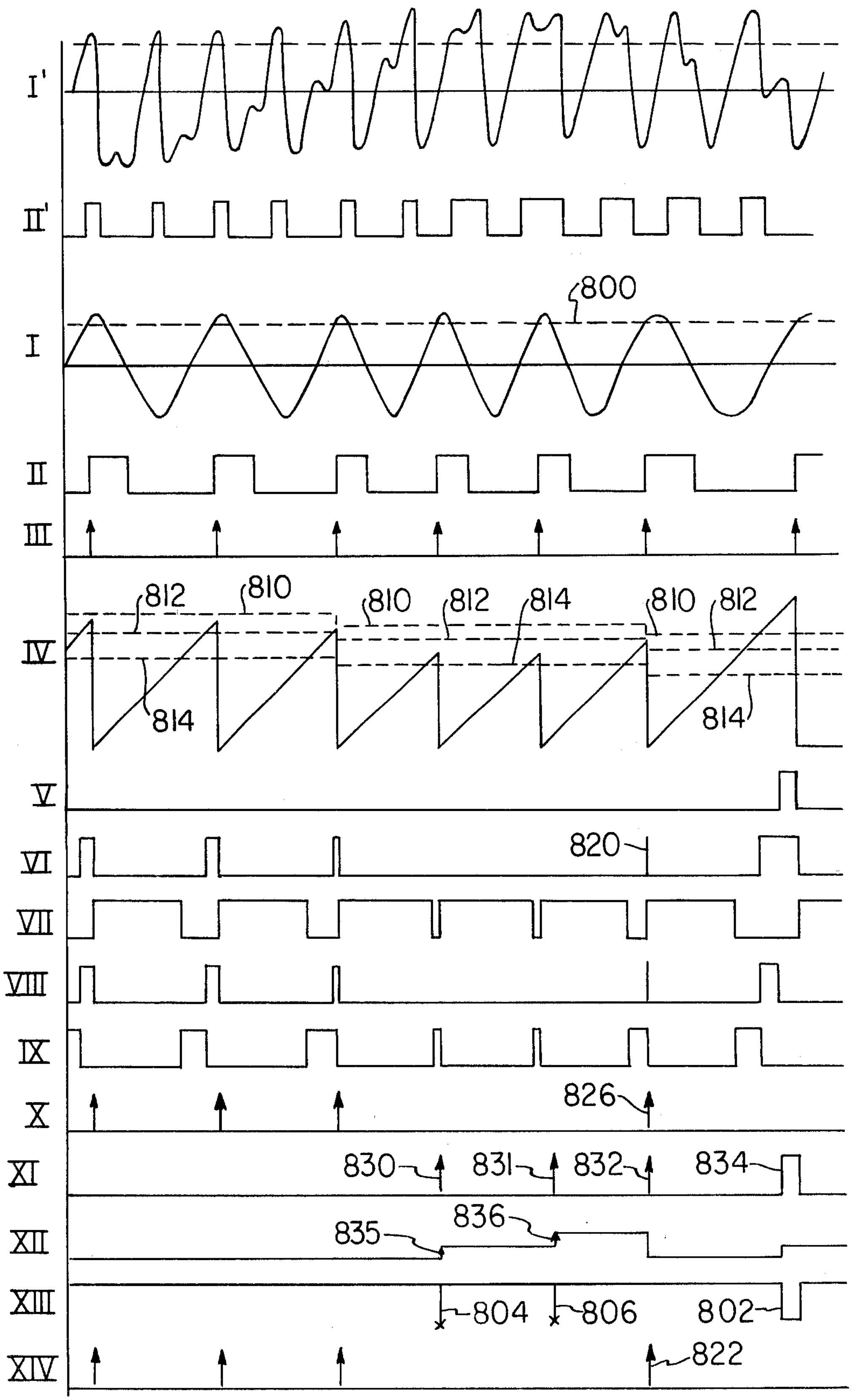
FIG. 8 is a wave form chart useful in describing the operation of the pitch detector illustrated in FIG. 6.

The detailed operation of pitch detector 600, a logic schematic diagram of which appears in FIG. 6, is best understood with the aid of the wave form chart of FIG. 8. In FIG. 8, each wave form is represented by a roman reference numeral and the reference numeral corresponding to each wave form (except wave forms I' and II') are placed at those points in FIG. 6 at which the corresponding wave form is produced. In general, the input signal applied to pitch detector 600 on lead 504, being derived from a vibrating string, tends to be rich in harmonics and therefore quite complex when represented as a wave form. Wave form I' of FIG. 8 is a wave form representation of a fairly simple vibrational mode of a string and illustrates the complex nature of the resulting wave forms. Waveform II' illustrates the binary version of waveform I' that would be produced in pitch detector 600. For convenience of description, no attempt has been made to illustrate the operation of pitch detector 600 with a realistic input wave form. Instead, the input wave form has been characterized as a sinusoid of varying frequency. This permits the exemplification of substantially all operating conditions without resort to an overly complex waveform chart.

Pitch detector 600 broadly comprises transition detector 601, period estimator 630, window generator 660, anomaly detector 680 and initializer 690. Transition detector 601 operates on the input signal received via lead 504, and produces: on lead 603, a pulse when the input signal crosses in a positive going direction through a threshold voltage proportional to the magnitude of the envelope of the input signal; and on lead 605, a pulse corresponding to each pulse on lead 603 and delayed therefrom by a predetermined interval. Transition detector 601 also produces a signal representing the envelope of the input signal and provides this envelope signal as an output on lead 602.

In response to the two pulse signals provided on leads 603 and 605, period estimator 630 produces: on lead 604, a voltage signal estimating the period of the input signal; and on lead 632, a voltage signal, wave form IV, which varys continuously so as to be proportional to the elapsed time since the most recent pulse provided on lead 603.

Under control of the elapsed time and period estimate signals provided from period estimator 630 via lead 632 and 634, respectively, window generator 660 produces a plurality of sampling window signals: on lead 662, it produces a late window signal, wave form V, which goes high when the elapsed time signal substantially exceeds the period estimate in amplitude; on lead 664 it produces a normal window signal, wave form VIII, which is high only when the elapsed time signal has an amplitude which is within a predemined range of the amplitude of the period estimate; on lead 666, it produces an early window signal, wave form IX, which goes high when the elapsed time signal amplitude is in a predefined range substantially below the amplitude of the period estimate; and on leads 668, it produces an enabling window signal, the complement of wave form VII, which is high whenever any one or more of the late, normal or early windows is high.

Anomaly detector 680 responds to the late, normal and early window signals provided from window generator 660 via leads 662, 664, and 666, respectively, to control, via lead 682, the updating of the period estimate level provided by period estimator 630 on lead 604. The period estimate level is updated by setting it equal to the amplitude of the elapsed time signal at the instant a data pulse is received on lead 603. In general, such updating will be done only if the normal window signal is high (i.e. if the elapsed time signal is within a predefined range of the period estimate level prior to updating). Anomaly detector 680 provides for updating when the normal window signal is not high. This is done when a predetermined number of consecutive anomalies occurs (i.e. when the late or early window signals are high during a predetermined number of consecutive pulses on lead 603). It will be appreciated that anomaly detector 680 permits a determination of pitch, the reciprocal of period, when a substantial change of pitch, such as a change in the note being played on the string, takes place. The requirement for a predetermined number of consecutive anomalies before such an update takes place assures that a false pitch change will not be detected when a single anomaly occurs as a result of interference, noise, etc.

Thus far, the discussion has concentrated on what could be considered as steady state operation of pitch detector 600. In operation, consecutive notes could be provided, for example, from different strings and have a drastic difference in pitch. The updating operation requiring a predetermined number of consecutive anomalies would be very slow, and therefore ineffective in producing a period estimate when a drastic change in pitch occurred. In order to speed acquisition of a new note pitch, initializer 690 is provided. The initializer is actuated when an attack pulse is received on lead 502, signaling a new striking or excitation of a string and the intended likelihood of a substantial change in pitch. Via lead 692, initializer 690 controls the operation of pitch detector 600 to update the period estimate level on lead 604 each time the input signal comes up to the threshold level built in to transition detector 601. This operation of initializer 690 occurs for a predetermined number of cycles of the input signal calculated to provide a good initial period estimate.

In transition detector 601, the input signal is provided to a buffer amplifier 606, the positive input of a comparator 608 and the negative input of a comparator 610. Amplifier 606 drives a peak or envelope detector network 609, comprising a diode, a resistor and a capacitor, and the resulting envelope is provied through a buffer amplifier 612 to output lead 602 and to a resistor divider network 614. The resistor divider network provides a fixed proportion of the envelope signal as a reference to the negative input of comparator 608 and the positive input of comparator 610 receives ground as a reference level. The outputs of comparators 608 and 610 are coupled through respective differentiating networks 616 and 618 to the S and R inputs, respectively, of an R-S flip-flop 620. Flip-flop 620 provides a squared-up version, wave form II, of the input signal and this squared-up signal is passed through a differentiating network 622 to obtain the pulse wave form III in which a pulse corresponds to each leading edge of a pulse in wave form II. Wave form III is transmitted through a bilateral swtich 624 under control of the window signal received from window generator 660 via lead 668. Pulses transmitted through gate 624 trigger a one shot 626, the Q output of which is applied as the pulse signal to lead 603 and the Q output of which triggers one shot 628. The Q output of one shot 628 is applied as a pulse signal to period estimator 630 via lead 605 and the $\overline{Q}$ output of one shot is applied through a differentiating network 625 and via lead 627 to period estimator 630.

In operation, flip-flop 620 is set each time the input signal, wave form I, comes up to the threshold level 800, which is a fixed proportion of the input signal envelope and therefore varies with the overall amplitude of the input signal. Setting flip-flop 620 produces a positive going transition at the Q output which produces a pulse in wave form III. Pulses produced on lead 603 substantially coincided with the pulses in wave form III and therefore with a positive going transition in wave form II. All pulses and positive going waveform transitions which are substantially coincident with he positive going edges in wave form II are indicated in FIG. 8 with an upwardly direct arrowhead. One shot 628 is triggered on the trailing edge of pulses produced on lead 603, so that pulses produced on lead 605 are delayed with respect to pulses produced on lead 603 by an interval equal to the width of pulses produced on lead 603. Owing to the scale of FIG. 8, which had to be selected for convenient description, the delay between the pulses produced on lead 603 and lead 605 is not perceptible. However, pulses and wave form transitions which appear to coincide with the pulses in wave form III but have no arrowheads thereon are coincident with the delayed pulses appearing on lead 605.

In period estimator 630, a linear sweep or time base signal is obtained by charging a capacitor 636 with a constant current source 638 of conventional design. A bilateral switch 640 is placed across capacitor 636 and is actuated by the pulses on lead 605 to discharge capacitor 636. The voltage appearing across capacitor 636 is applied as an input signal to a buffer amplifier 642, the output signal of which is wave form IV appearing on lead 632. The output signal of amplifier 642 is coupled through a bilateral switch 644 to a capacitor 646 and through a buffer amplifier 648 to leads 604 and 634. The bilater switch 644 is controlled with the output signal of a two input AND gate 650 which produces the wave form XIV. The two inputs to AND gate 650 are the pulses on lead 603 and the $\overline{Q}$ output, wave form XIII, of a D flip-flop 652. The D input to flip-flop 652 is the disabling signal from initializer 690, provided via lead 654, which signal is high for a predetermined number of cycles following an attack pulse on lead 502. Flip-flop 652 is clocked via lead 65 with the signal from anomaly detector 680, which signal includes a pulse each time an anomaly occurs, in the absence of the number of consecutive anomalies required to produce an update. In addition, flip-flop 652 is preset with the late window signal provided from window generator 660 via leads 662 and 658. The flip-flop is reset with pulses received from transition detector 601 via lead 627. These pulses coincide with the trailing edge transitions of pulses produced on lead 605 and are therefore doubly delayed with respect to the pulses on lead 603 (i.e. their trailing edges are delayed with respect to the trailing edges of the pulses on lead 603 by an interval equal to two pulse widths).

In operation, the linear sweep in period estimator 630 produces a saw tooth wave form, waveform IV in which each saw tooth has a negative going transition coincident with a pulse on lead 605, which was delayed with respect to a corresponding pulse on lead 603. Switch 644 and capacitor 646 cooperate to sample and hold the level of wave form IV each time a pulse appears in wave form XIV. The pulses in wave form XIV are those pulses on lead 603 which are enabled to pass through AND gate 650 by wave form XIII. Clearly, this wave form will be low any time the preset input, wave form V, is high (hence, the pulse 802 in wave form XIII). In addition, wave form XIII must go high whenever its reset input is high. Thus, this wave form goes high, if it is not already high, shortly after each transition in wave form III (i.e. when a pulse occurs on lead 627). Assuming steady state operation, the T input to the flip-flop will be low, so that wave form XIII must also go low whenever a pulse occurs on lead 656. As will be explained below, a pulse occurs on lead 656 when the count in anomaly detector 680 is incremented, and this is substantially coincident with the pulses in wave form III. Hence, the pulses 804 and 806 in wave form XIII, which are indicated with X marks at their tips, each have a leading (negative going) edge substantially coincident with a pulse in wave form III and a trailing (positive going) edge which occurs after a transition in wave form IV. Thus, the pulses 802, 804 and 806 are each coincident with a pulse in wave form III and, since the pulses in wave form XIII disable AND gate 650, wave form XIV includes a pulse coincident with those pulses in wave form III during which a pulse is not present in wave form XIII. The pulses in wave form XIV represent those instants at which the period estimate level is updated.

In window generator 660, a period estimate level coupled via lead 632 is applied to a resistor divider network 670, which applies a fixed fraction of the period estimate level to the plus inputs of comparators 674 and 676 and to the minus input of comparator 678. Resistor network 672 applies predetermined fractions of the duration signal coupled via led 634 to the minus input of comparator 674, the minus input of comparator 676 and the plus input of comparator 678, respectively. In the preferred embodiment, the resistive networks 670 and 672 are designed so that the output of comparator 674 goes high when the elapsed time exceeds a high threshold which is approximately 106 percent of the period estimate level, the output of comparator 676 goes high when the elapsed time exceeds an intermediate threshold approximately equal to 90 percent of the period estimate level, and the output of comparator 678 goes high when the elapsed time signal is below a low threshold approximately equal to 70 percent of the period estimate level. The output of comparator 674 is applied to lead 662 and as an input to EXCLUSIVE-OR gate 673. The output of comparator 676 (wave form IV) is applied as an input to EXCLUSIVE-OR gates 673 and 677, respectively. The output of comparator 678 (wave form VII) is applied as an input to EXCLUSIVE-OR gate 677 through an inverter 673 and is also in input to a two input NAND gate 675. The other input to the NAND gate 675 is the disable signal from initializer 690, which is coupled via lead 692.

Referring to wave form IV of FIG. 8, the high, intermediate and low thresholds are superimposed on the saw tooth wave form as dotted lines 810, 812 and 814, respectively. It should be noted that these thresholds shift in amplitude each time the period estimate is updated to a new value (in FIG. 8 this occurs simultaneously with the last two pulses in wave form XIV). Referring to wave form V and wave form VI, it will be noted that these wave forms are high only when wave form IV exceeds thresholds 812 and 810, respectively. Wave form VII is high only when wave form IV is below low threshold 814.

Pulse 820 in wave form VI warrants further discussion. This pulse occurs immediately after pulse 822 and wave form XIV causes a period estimate update, so that capacitor 646 is charged to the voltage on capacitor 636 (a new value) just before capacitor 636 is discharged. As a result there is downward shift of thresholds 810, 812 and 814 and this momentarily causes the period estimate level and elapsed time signal to be equal. Since the elapsed time signal then equals 100 percent of the period estimate level, it momentarily exceeds the new intermediate threshold 812, and the pulse 820 is produced.

Through the action of EXCLUSIVE-OR gates 673 and 677, wave form VIII on lead 664 is high only when wave forms V and VI are at different levels and wave form IX is high only when the wave forms VI and VII are at the same level. It will be appreciated that the wave forms V, VIII and IX correspond to the late, normal, and early window signals, respectively. Continuing this analogy, the late window signal is high when wave form IV exceeds threshold 810, the normal window signal is high when wave form IV lies between the thresholds 810 and 812, and the late wave form signal is high only when the wave form IV lies between the thresholds 812 and 814. In the steady state operation, the signal on lead 668 is merely the complement of wave form VII.

In anomaly detector 680, the late window signal, wave form V, is received vias lead 662 and 681 as an input to an EXCLUSIVE-OR gate 682. In addition, the normal window signal, wave form VIII, is received in AND gate 684 via lead 664 and the early window signal, wave form IX, controls a bilateral gate 686 via lead 666. The pulses on lead 603 are coupled to gate 686 and AND gate 684 via leads 607 and 685. These pulses are then transmitted through gate 686 as an input to EXCLUSIVE-OR gate 682. The output of AND gate 684, wave form X, is applied as the reset input to a counter 688 and the output of EXCLUSIVE-OR gates 682, wave form XI, is applied as an input to two input AND gate 683. The other input AND gate 683 is the output of inverter 681, which detects the occurrence of a particular count in counter 688. The output of AND gate 683 clocks the counter 688 and is also coupled to lead 656. In the preferred embodiment, anomaly detector 608 permits an update of the period estimate level on the third consecutive occurrence of an anomaly. Thus, counter 688 may include only two stages.

In operation, gate 686 transmits pulses received via lead 607 and 685 when the early window signal, wave form IX, is high; and AND gate 684 transmits the same pulses when the normal window signal, wave form VIII is high. Inasmuch as the pulses produced by AND gate 684, wave form X can occur only when wave form IV is in the normal range (between thresholds 810 and 812), counter 688 can only be advanced past the count of one by a consecutive string of pulses in wave form XI, since a single pulse in wave form X resets it to a zero count. Inverter 681 feeds back the most significant bit of counter 688 as a disable to AND gate 683, permitting advancing of counter 688 only until a count of two is reached. Wave form XI, at the output of EXCLUSIVE-OR gate 682 includes a pulse or a positive going transition only when window generator 660 indicates that an anomaly is present. Thus, successive anomalies cause the count of counter 688 to be incremented until inverter 681 disables AND gate 683.

Wave form XII is a graphical representation of the count of counter 688. As can be seen, the sequence of pulses 830, 831 and 832 in wave form XI clocks counter 688 and also clocks flip-flop 652 of period estimator 630 via lead 656. In counter 688, the pulses 830 and 831 cause successive incrementations 635 and 836 in the count wave form XII. When the count of two is reached, AND gate 683 is disabled, so that pulse 832 is transmitted to neither counter 688 nor led 656. Assuming steady state operation, pulses 830 and 831 clock the low level on the D input into flip-flop 652, producing the pulses 804 and 806 in wave form XIII, to disable AND gate 650 and prevent updating of the period estimate level. When the pulses 804 and 806 end, waveform XIII returns to the high level, thereby enabling AND gate 650. Pulse 832 is coincident with the next pulse transmitted on lead 603. Inasmuch as pulse 832 is blocked from transmission onto lead 656, it has no effect on wave form XIII, which remains high, thereby enabling the pulse on lead 603 to cause a period estimate update.

The period estimate update, which is substantially coincident with pulse 822 in wave form XIV, causes the high, medium, and low thresholds 810, 812 and 814 to be redefined in terms of the new values of the period estimate (see wave forms IV and XIV). At the instant of this re-evaluation, the period estimate level and elapsed time signal are substantially equal in amplitude and momentarily cause the pulse 820 in wave form VI, which is transmitted through exclusive or gate 674 as pulse 825 in the normal window signal, wave form VIII, permitting the pulse 826 (in wave form X) to be transmitted through AND gate 684. Pulse 826 resets counter 688, thereby permitting the normal counting operation to resume (hence the transition 834 in wave form XI causes counter 688 to be incremented.

In the preferred embodiment, initializer 690 introduces a delay of four cycles of the input signal before steady state operation of pitch detector 600 ensues. This is achieved by utilizing a three bit counter 694 and sensing when the most significant bit goes high. The clock input to counter 694 is provided from a two input AND gate 696 which receives as one input the most significant bit coupled through an inverter 695. The other input to AND gate 696 is the pulse signal on lead 603 which is coupled via lead 607. The inverted most significant bit signal provided by inverter 695 is the initialization enable signal which is coupled to window generator 660 via lead 692 and to period estimator 630 via lead 654. The initialization enable signal is high during initialization and goes low when steady state operation ensues.

In operation, counter 694 is reset upon the occurrence of an attack pulse on lead 502. While the most significant bit remains low, pulses received on lead 607 cause successive incrementations of the counter. When the most significant bit goes high (indicating a count of four), the initialization enable signal goes low, thereby blocking transmission through AND gate 696 and disabling further incrementation of counter 694. When the initialization enable signal goes low, pitch detector 600 also enters the steady state mode of operation.

From the detailed description of pitch detector 600, certain broad operative concepts of the invention will be observed which extend beyond the preferred embodiment and any particular combination of apparatus. These are:

1. Detecting corresponding points in successive cycles of a complex input signal by generating a threshold voltage which is proportional to the envelope of the input signal and selecting input signal crossings of the threshold voltage in a predefined direction, as corresponding reference points in consecutive cycles of the input signal.

2. Estimating the duration of a cycle of the input signal by updating the duration to the duration of the most recent cycle when the duration of the most recent cycle is within a predefined, adaptably determined range of the latest estimate of cycle duration, the adaptive range being defined as a percentage of the value of the most recent estimate of period duration.

3. Detecting a substantial, non-abrupt change in period indicative of an actual change in frequency of the input signal by determining when a predetermined number of consecutive cycles have periods out of the predetermined adaptive detection range and, under these circumstances accepting as the new period estimate the period of the most recently received cycle of the input signal.

4. Speeding production of a period estimate when a new note is being produced (characterized by an abrupt change in pitch) by accepting, the period of each successive input signal cycles as the period estimate for a predetermined number of initial cycles.

Duration Timer 700

Duration Timer 700 produces a binary wave from which is high for the duration of each cycle of the input signal envelope. In a stringed instrument, such as a guitar, this function has particular relevance, since a player can curtail or damp the duration of the envelope by simply lifting the fingers of the right hand off the strings being played.

Duration Timer 700 broadly comprises a damping detector 710 and an envelope duration timer 750. Damping detector 710 senses the envelope signal received from pitch detector 600 via lead 706 and, on lead 712, produces an enable signal which enables envelope duration timer 750. The damping detector, by sensing the rate of decay of the envelope, determines when the string being played has been damped by finger lift off and immediately terminates the pitch duration signal by making the enable signal on lead 712 go low.

Envelope duration timer 750 is controlled by damping detector 710, as explained above, and responds to the envelope of the input signal on lead 706 and the attack pulse received from string separators 500 via leads 502 and 704, to produce a binary signal, on lead 702, which is high for the full duration of each input signal envelope cycle.

In damping detector 710, the envelope signal is applied to the negative input of a comparator 720 and the positive input of comparator 722. The second input to each of comparators 720 and 722 is a reference voltage which is provided from a resistor divider string 724 connected between the positive voltage supply and ground. On the resistor divider string 724, the positive input of comparator 720 is connected to a higher reference voltage than the negative input of comparator 722. The output signal of comparator 720 is applied as an input to AND gate 726, both directly and through an integrating network 728 and an inverter 730. The output of comparator 722 is provided to the D input of flip-flop 730, and the flip-flop is clocked with the output signal of NAND gate 726. The enabling signal on lead 712 is provided from the Q output of flip-flop 732.

In operation, the positive going transition of the envelope signal causes the output of comparator 722 to go high before the output of comparator 720 goes low, since the reference voltage for comparator 722 is lower than the reference voltage for comparator 720. The negative going transition at the output of comparator 720 produces a positive going transition at the output of NAND gate 726, which clocks the high output of comparator 722 into flip-flops 732, causing the enable signal on lead 712 to go high. The output of comparator 720 remains low until the decay of the envelope begins so that integrating network 728 and inverter 730 cannot affect operation of damping detector 710 until the envelope begins to decay. When the decaying envelope reaches the level of the reference voltage for comparator 720, the output of that comparator once again goes high, so that both inputs to NAND gate 726 are high and its output goes low. At the same time, the input of inverter 730 charges gradually towards a high level through integrating network 728. When the input to inverter 730 reaches the high level, its output goes low, causing the output of NAND gate 726 to go high, thereby clocking flip-flop 732. The Q output of flip-flop 732 will then either go high or low, depending on whether the output of comparator 722 is high or low at the instant that the output of NAND gate 726 goes high.

In practice, the values of the resistor and capacitor in integrating network 728 are selected so that a normally decaying envelope signal would not pass below the threshold for comparator 722 before the output of NAND gate 726 goes high. In addition, the value of the resistor and capacitor are such that a damped decaying envelope would decay below the threshold of voltage for comparator 722 before the output of NAND gate 726 goes high. Thus, when the output of NAND gate 726 goes high, the D input of flip-flop 732 will receive a high signal if the envelope is decaying normally and a low signal if the envelope has been damped. The damped envelope therefore causes the Q output of flip-flop 732 to go low, resulting in the disappearance of the enabling signal on lead 712 and the immediate termination of the pitch duration signal on lead 702. On the other hand, if the envelope is decaying normally, the Q output of 732 remains high and the termination of the pitch duration signal on lead 702 is determined by envelope duration timer 750, as will be explained below.

In envelope duration timer 750, the envelope signal received on lead 706 is applied to the positive input of a comparator 752 and attack pulses received on lead 704 are applied to the input of an inverter 754. The negative input to comparator 752 is provided from a string 756 of three resistors connected in series between the positive voltage source and ground, the comparator negative input being connected to the junction between the two resistors closest to the positive voltage source. The emitter and collector of a transistor 758 are connected to respective ends of the middle resistor in the chain 756 and the base of transistor 758 is controlled through a resistor divider network 760 which is connected between the output of a NAND gate 762. The inputs to NAND gate 762 are the output of comparator 752 and the enable signal received from damping detector 710 on lead 712. The output of comparator 754 is applied through a delay network 764, comprising a diode, a resistor and a capacitor, to one input of a two input NAND gate 766, the other input to which is the output of NAND gate 762. The output of NAND gate 766 is provided to the base of an emitter follower transistor amplifier 768, which serves as a driving amplifier for the pitch duration signal on lead 702.

Envelope duration timer 750 is inopertive unless the enable signal on lead 712 is high. It will therefore be assumed that this signal is high in describing the operation of the envelope duration timer. When the envelope signal on lead 706 first begins to build up, it will be below the threshold voltage applied to comparator 752, so that the output of comparator 752 is low. As a result, the output of AND gate 762 is low and the voltage coupled to the base of transistor 758 via divider network 760 tends to bias transistor 758 in an off state. The reference voltage applied to comparator 752 is then determined by all three resistors in the chain 756. When the envelope signal rises above this reference voltage, the output of comparator 752 goes high. This causes the output of AND gate 762 to go high and results in the base of transistor 758 going high, thereby turning on the transistor. When transistor 750 turns on, it serves as a low impedance shunt across the center resistor in strings 756, so that the reference voltage provided to the comparator 752 is essentially determined by the values of the two outside resistors of the string. As a result, the new reference voltage will be lower than it was originally.

Through proper selection of the ratios of the resistors in string 756, specific reductions in reference voltage can be achieved. This permits the envelope duration timer 750 to operate with historesis, detecting envelope build up with a more critical criterion than envelope decay. This is desirable because it avoids false detection of envelope presence while applying a looser criterion to envelope decay, once it has been established that the envelope is present.

When an attack pulse appears on lead 704, inverter 764 provides a negative pulse to timing circuit 764. This pulse rapidly charges capacitor negatively through the diode, so that AND gate 766 is disabled during the presence of an attack pulse and continues to be disabled when the attack pulse disappears. After the attack pulse appears, the capacitor and delay circuit 764 is charged positively from the positive voltage supply through the resistor until the voltage of the capacitor reaches a level at which AND gate 766 is turned on. The time required to reach this turn on level is determined by the time constant of the resistor-capacitor network. Once AND gate 766 is enabled, inverter 754 and delay network 764 have no further effect on operation of envelope duration timer 750. The time constant of the delay network 764 is selected so that AND gate 766 is always enabled before the envelope signal on the lead 706 approaches a value which would tend to make the output signal of inverter 752 go high. Thus, once an attack pulse has been received, the level of the pitch duration signal on lead 702 is determined entirely by the output of AND gate 762. This output goes high when the envelope signal crosses the relatively high threshold voltage for build up and goes low when the envelope passes below the relatively low threshold voltage for envelope decay. If the enable signal on lead 712 goes low at any time, it will be appreciated that the output of NAND gate 762 must go low, resulting in an immediate drop of the pitch duration signal to the logical zero level.

Alternate Embodiment

An alternate embodiment of pitch detector 600 permits simultaneous detection of the pitch of a plurality of different signals representing different musical sounds by processing the signals in a single detector on a time-shared basis. This requires an alternate embodiment 630' of period estimator 630, as well as some modifications to anomoly detector 680 and initializer 690.

Figure 9:
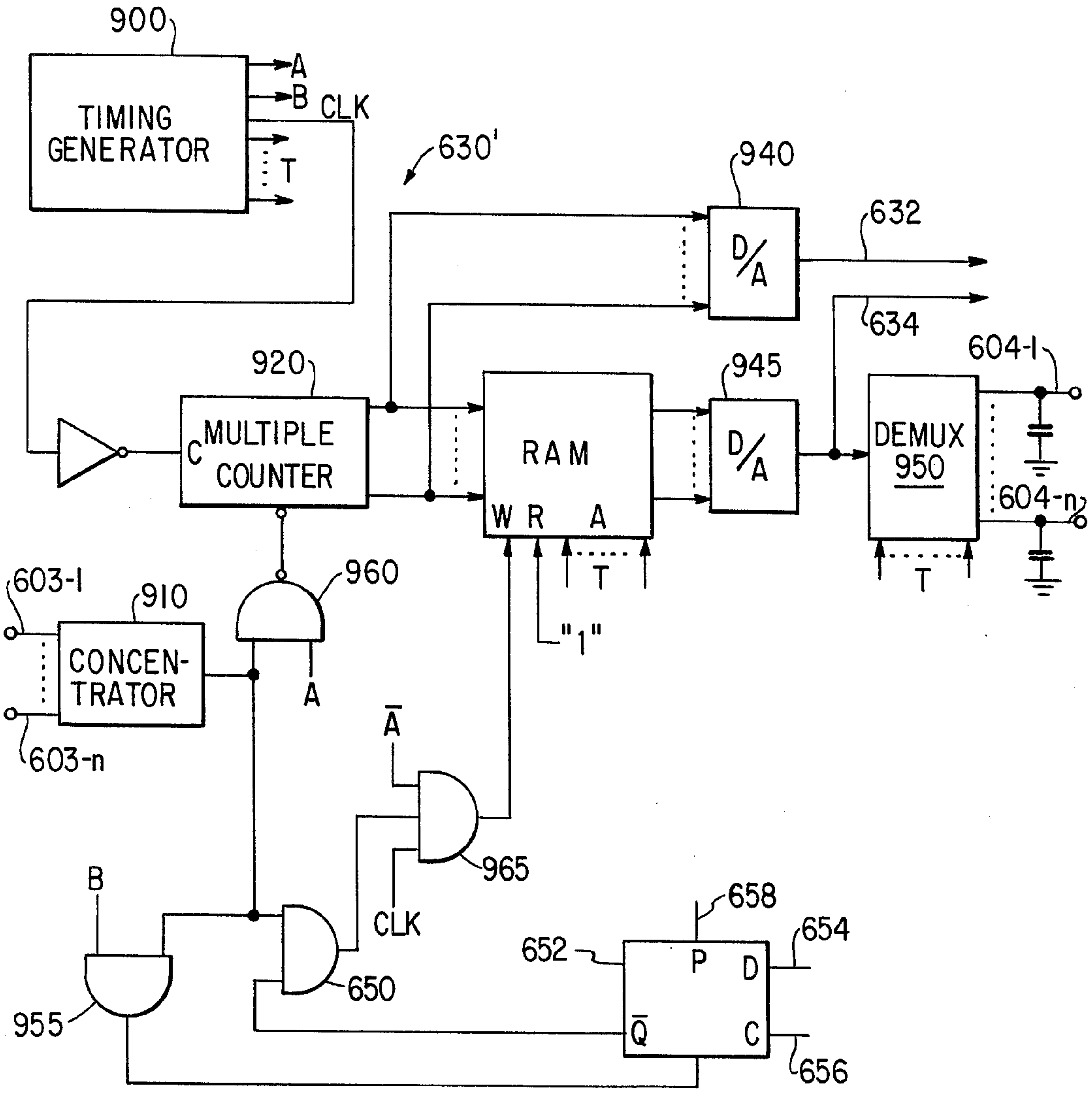
FIG. 9 is a logic schematic diagram illustrating a second preferred embodiment of a pitch detector in accordance with the present invention.

A logic schematic diagram of period estimator 630' is illustrated in FIG. 9. In order to use this period estimator, each input signal source must be provided with a transition detector similar to transition detector 601, only the output leads 603 of which is utilized. Assuming there are n input signals, the output leads of the transition detector will be designated 603-1 through 603-n, all of which are applied to period estimator 630'. Likewise, the output signals of period estimator 630' which represent the period estimates for the respective input signals, are represented by the refrence numerals 604-1 through 604-n, respectively. In general terms, transition detector 630' is a digital version of period estimator 630, which is time-shared among the n input signals, i.e. period estimator 630' operates in n repetitive phases or time slots, in each of which it processes the information from a respective input signal.

Period estimator 630' comprises: a timing generator 900, which produces timing signals for the pitch detector; a concentrator 910, which receives the pulses from each of the transition detectors and interlaces them, placing each one in a respective time slot; a multiple counter 920 which keeps a running count of the number of high frequency pulses occuring between consecutive input pulses in each input signal; an RAM 930, which stores the high frequency pulse count for each input signal when an input pulse occurs for that signal; digital-to-analog converters 940 and 945, which convert the digital output of multiple counter 920 and memory 930, respectively, to analog voltage signals, which are provided via leads 632 and 634, respectively, to a window generator 660, as in FIG. 6; and a demultiplexer 950 which separates the interleaved output of digital-to-analog converter 945 into n separate anlog signals. Period estimator 630' also includes an AND gate 650 and a flip-flop 652 which are identical to the correspondingly numbered components in period estimator 630 and operate in identical fashion thereto, as well as AND gates 655, 660 and 665, which will be discussed in more detail below.

Figure 12:
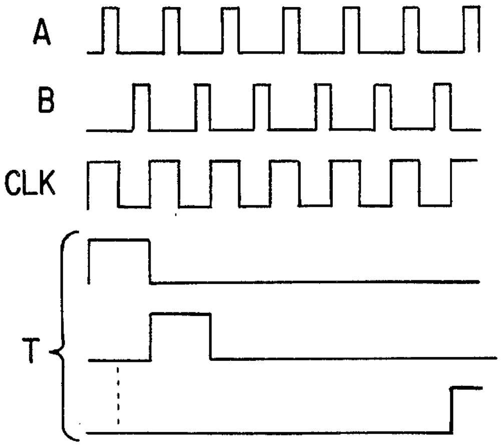
FIG. 12 is a timing diagram illustrating the timing waveforms produced by timing generator 900.

The details of timing generator 900 will not be discussed here. In general, it includes a high-frequency oscillator, dividing counter and logic elements (not shown) in a conventional arrangement to produce the timing wave forms A, B, CLK and the waveform group T (illustrated in FIG. 12). The wave form CLK is the system clock and the wave form group T comprises n separate wave forms, each of which is high during a respective time slot only. Each of the wave forms in the group T, when it is high, causes the counts for the respective time slots (corresponding to elapsed time since the last input pulse on the corresponding one of leads 603-1 to 603-n) to be incremented. Each of these counts is a digital staircase approximation of wave form IV of FIG. 8.

The frequency of the wave forms in group T will determine how many counts correspond to a given voltage amplitude change: the higher the frequency, the more steps per given voltage (greater resolution) change and the closer the output signal on the lead 604-1 through 604-N will approximate a continuous saw tooth. The frequency of each of the wave forms in group T and will, therefore, be determined by the desired resolution at the output of the pitch detector and the system CLK will be n times that frequency.

In operation, multiple counter 920 has a count, for each time slot, which is incremented by one each time that time slot occurs. Thi results in a digital stepwise signal being generated for each time slot. The counts for the various time slots are, however, interleaved so that digital to analog converter 940 produces, on leads 632, an analog signal including interleaved samples of the respective stepwise staircase wave form in the respective time slots. Memory 930 stores a digital word, corresponding to the period estimate, for each time slot. These words are stored in the memory so that the application of the group T wave forms to the address inputs of the memory produces the respective period estimate at the output of the memory during each time slot. Thus, during each time slot, period estimator 630' provides an elapsed time sample on lead 632 and the respective period estimate sample on lead 634 and window generator 660 and operates during each time slot, in the same manner as in the embodiment of FIG. 6.

Concentrator 910 receives input pulses coincident with the crossing of the triggering threshold, for each input signal. These are interleaved so as to coincide with the correct time slot in concentrator 910, which produces a serial pulse train. Flip-flop 652 serves the same purpose as it did in the embodiment of FIG. 6, i.e. to disable updating (in this case, reading a new work into memory 930) when an anomaly occurs, unless it is the third consecutive anomaly. Assuming flip-flop 652 does not disable updating, when concentrator 910 produces a pulse in a given time slot, the pulse is immediately transmitted through AND gate 650 and, during the initial portion of the time slot when the CLK wave form is high and the A wave form is low the pulse is transmitted through and gate 965 and causes memory 930 to write the new period estimate thereinto. When wave form A next goes high, the pulses is transmitted to the reset input of multiple counter 920 through NAND gate 960 and causes the portion of the counter dedicated to that time slot to be reset, thereby resetting the respective saw tooth approximation to the zero level.

Inasmuch as wave form A has gone high, the wright input to memory 930 is disabled, so that the zero is not written into the memory. Instead, the memory displays, at its output, that word that was previously stored. This causes the corresponding voltage level to be produced on lead 634 by digitalto-analog converter 945. In those cases where flip-flop 652 has disabled AND gate 650 and no new word would have been written into memory 930 prior to resetting counter 920 and the memory displays some previously stored word. Under these circumstances, when wave form B goes high, the pulse from concentrator 910 is transmitted through AND gate 955 and resets flip-flop 652 in preparation for the next time slot.

Demultiplexer 950 receives as control inputs the wave form group T, and as a data input the analog output of digital-to-analog converter 945. Thus, the demultiplexer distributes to the respective leads 604-1 through 604-n the correct sample from digital-to-analog converter 945. Inasmuch as each output of the demultiplexer has a capacitor connected thereto, the period estimate for each time slot is held on each of leads 604-1 through 604-n for the full duration between consecutive time slots. Demultiplexer 950 therefore serves as a multiple sample and hold gate.

Figure 10:
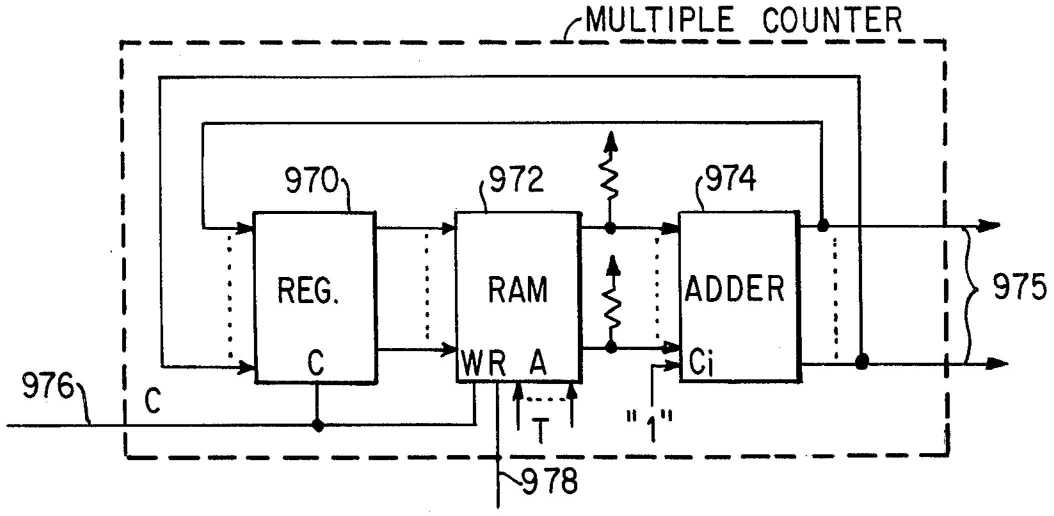
FIG. 10 is a logic schematic diagram illustrating the details of a multiple counter utilized in the embodiment of FIG. 9.
Figure 11:
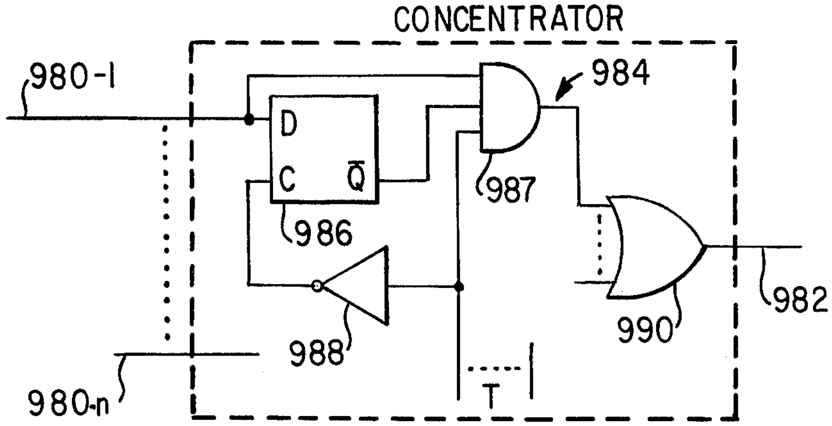
FIG. 11 is a logic schematic diagram illustrating the details of the concentrator as used in the pitch detector embodiment of FIG. 9.

The only modification required for anomaly detector 680 is that counter 688 be replaced by a multiple counter similar to multiple counter 920 (detailed construction thereof is shown in FIG. 10). As for initializer 690, two modifications are necessary: counter 694 is replaced by a multiple counter and the attack pulse corresponding to each input signal must be provided to a respective input of a concentrator similar to concentrator 910 (detailed construction thereof is shown in FIG. 11) and the interleaved signal provided by the concentrator is coupled to the reset input of the multiple counter.

FIG. 10 illustrates the detailed description of a multiple counter as utilized in the alternate embodiment of pitch detector 600. The multiple counter comprises a register 970; a random access memory 972, each output of which is coupled to the positive voltage supply through a pull-up resistor; and an adder 974 in which one input word is all zeros and the carry input is permanently wired to a logical 1. Memory 972 receives as an input word the output word of register 970 and provides its output word as the second input word to adder 974. The output word of adder 974 is the output word of the counter and is also fed back as the input word to register 970. The clock input of the counter is connected to the clock input of register 970 and the wright input of memory 972. The reset input of the multiple counter is applied to the read input of memory 972.

Under the control of wave form group T, memory 972 repetitively sequences through the storage areas corresponding to respective time slots. In the absence of a reset signal (in this case a reset occurs on a low level on the reset input), the read input to memory 972 is high, so that the word stored in each memory location appears at the output of the memory as soon as that location is accessed. This word is applied to the input of adder 974 in addition to the all zeros word and the logical one carry in, which results in the output word of adder 974 being one higher than its input word. This incremented word is transferred through latch 970 when the clock input goes high (in the illustrative embodiment, in the middle of the time slot). In the absence of a reset, this sequence of operations is repeated for each time slot as wave form group T sequences memory 972 therethrough. Thus, a digital staircase wave form is generated for each time slot.

When a reset signal is applied to the reset input (a low level resets), reading of memory 972 is disabled and all outputs go high as a result of the pull-up resistors connected thereto. Adder 974 adds one (the carry input) to the all ones word thereby producing an all zeros word at its output. This all zeros word will then be transferred through resistor 970 into memory 972 when the clock input goes high, thereby resetting the respective memory location.

A schematic logic diagram for a concentrator, as employed in the alternate embodiment, is illustrated in FIG. 11. The concentrator includes a plurality of inputs 980-1 to 980-n and a single output 982. A plurality of identical networks 984 are each connected to a respective input. Each network 984 includes a D flip-flop 986, an AND gate 987, and an inverter 988. Each input to the concentrater is applied to the D input of the respective flip-flop 986 and one input of the AND gate 987. The $\overline{Q}$ output of the flip-flop is provided as a second input to the AND gate 987. A third input to the AND gate is a respective one of the wave forms from the wave form group T, which is also coupled to the C input of the flip-flop through the respective inverter 988. The outputs of all of the AND gates 987 are provided to a single OR gate 990, which provides the output of the concentrator on lead 982.

In operation, assuming the flip-flop to be in the reset state, when the pulse in one of the wave forms in group T goes high, the respective AND gate 987 will be enabled and will transmit a pulse if it appears on the respective input (e.g. 980-1), which pulse will be transmitted through AND gate 987 and OR gate 990 to lead 982. When the time slot pulse terminates AND gate 987 is disabled and the pulse from the respective input is no longer transmitted to the output 982. At the same time, the negative transition of the time slot pulse causes the flip-flop to be set, so that the $\overline{Q}$ bar output goes low. Should the pulse at the input still be present the next time the time slot is accessed, it will not be transmitted to output 982, since AND gate 987 is disabled by the low output at the $\overline{Q}$ output of flip-flop 986. This flip-flop will be reset when the pulse at the corresponding input disappears, in preparation for the receipt of a subsequent pulse. As a result of the connection of the networks 984 sequentially to output 982, the concentrator interleaves pulses appearing at its input.

Although specific embodiments of the invention have been disclosed left for other purposes, it would be appreciated by those skilled in the art that many additions, modifications, and substitutions are possible without departing from the scope and spirit of the invention as defined in the accompanying claims.

What is claimed is:

1. An auxiliary pick-up for use in a stringed musical instrument having an electromagnetic pick-up mounted thereon in addition to said electromagnetic pick-up, which electromagnetic pick-up includes a pole piece and at least one winding dedicated to each string of said instrument and mounted in spaced relationship therefrom, the auxiliary pick-up comprising:

a substantially planar substrate of non-conductive material adapted to be mounted intermediate said strings and said electromagnetic pick-up in spaced relationship from said strings;

a plurality of conductive, electrically isolated coils on said substrate, each coil positioned to be in alignment with a different pole piece when said substrate is in its mounted position, said coils sensing vibrations of said strings independently of said windings when said substrate is in its mounted position.

2. An auxiliary pick-up for use in a stringed musical instrument having an electromagnetic pick-up mounted thereon, which electromagnetic pick-up includes a pole piece dedicated to each string of said instrument and mounted in spaced relationship therefrom, the auxiliary pick-up comprising:

a substantially planar substrate of non-conductive material adapted to be mounted intermediate said strings and said electromagnetic pick-up in spaced relationship from said strings;

a plurality of conductive coils on said substrate, each coil positioned to be in alignment with a different pole piece when said substrate is in its mounted position, each coil being formed from a conductive coating on said substrate and comprising an elongated conductor in the shape of a helix, said substrate further including means for making an electrical connection to each coil.

3. An auxiliary pick-up for use in a stringed musical instrument having an electromagnetic pick-up mounted thereon, which electromagnetic pick-up includes a pole piece dedicated to each string of said instrument and mounted in spaced relationship therefrom, the auxiliary pick-up comprising:

a substantially planar substrate of non-conductive material adapted to be mounted intermediate said strings and said electromagnetic pick-up in spaced relationship from said strings;

a plurality of conductive coils on said substrate, each coil positioned to be in alignment with a different pole piece when said substrate is in its mounted position, each coil including component conductors on opposite faces of said substrate, said component conductors being joined by a conductive connection so as to form one continuous coil.

4. An auxiliary pick-up in accordance with claim 3 wherein each coil is formed from a conductive coating on said substrate and comprises an elongated conductor in the shape of a helix, said substrate further including means for making an electrical connection to each coil.

5. An auxiliary pick-up in accordance with any preceding claim wherein said substrate includes a hole therethrough corresponding to each coil, each hole being substantially circumscribed by the corresponding coil and being dimensioned to receive the corresponding pole piece therein.

6. A separator for use with a plurality of sensors, each providing an electrical signal with a time-variable envelope representing a respective received musical sound, each sensor being dedicated to a different sound source, but also being capable of excitation by other sound sources, said separator comprising:

a plurality of input terminals each dedicated to receive the signal from a different sensor;

an output terminal;

a conductive path from each input terminal to said output terminal; and means responsive to the envelope of the signal applied to each input terminal for opening the conductive paths from input terminals other than the one having the fastest build up in the envelope of its received signal.

7. A separator in accordance with claim 6 wherein said opening means includes first component for opening the conductive path from each input terminal as long as the envelope of its received signal fails to build up faster than at a predetermined threshold rate and a second component controlled by groups of at least two input terminals for opening the conductive path from the input terminals in each group other than the one with the fastest build up in the envelope of its received signal.

8. In combination with a separator in accordance with claims 6 or 7, an auxiliary pick-up for use in a stringed musical instrument having an electromagnetic pick-up mounted thereon, which electromagnetic pick-up includes a pole piece dedicated to each string of said instrument and mounted in spaced relationship therefrom, the auxiliary pick-up comprising:

a substantially planar substrate of non-conductive material adapted to be mounted intermediate said strings and said electromagnetic pick-up in spaced relationship from said strings;

a plurality of conductive coils on said substrate, each coil positioned to be in alignment with a different pole piece when said substrate is in its mounted position; and means for connecting each of said coils to a respective input terminal to act as the sensor therefor.

9. In combination with a separator according to claims 6 or 7, a transition detector responsive to the one signal at said output terminal for generating a binary signal in which each cycle has a period that is substantially equal to the corresponding cycle in said one signal, said transition detector comprising:

a source of an adaptive threshold voltage proportional to the envelope of said input signal; and means for generating a binary signal having a triggering edge coincident with each crossing of said input signal through said threshold level in a predefined direction.

10. The combination of claim 8 further comprising a transition detector responsive to the one signal at said output terminal for generating a binary signal in which each cycle has a period that is substantially equal to the corresponding cycle in said one signal, said transition detector comprising:

a source of an adaptive threshold voltage proportional to the envelope of said input signal; and means for generating a binary signal having a triggering edge coincident with each crossing of said input signal through said threshold level in a predefined direction.

11. The combination of claim 9 further including apparatus for estimating the period of said one signal, comprising:

means for storing a period estimate;

means for measuring the duration between predefined triggering points in each cycle of said input signal;

means for generating first and second threshold signals each having a value which is a different predetermined proportion of said stored period estimate, said threshold signals defining a variable normal window therebetween; and means actuated when said triggering point occurs in a newly received cycle of said input signal for entering into said storage means a signal representing the time interval between the triggering points in the two most recently received cycles, said entering means including means disabling entry of said interval representing signal when said interval of time does not fall within said normal window.

12. The combination of claim 10 further including apparatus for estimating the period of said one signal, comprising:

means for storing a period estimate;

means for measuring the duration between predefined triggering points in each cycle of said input signal;

means for generating first and second threshold signals each having a value which is a different predetermined proportion of said stored period estimate, said threshold signals defining a variable normal window therebetween; and means actuated when said triggering point occurs in a newly received cycle of said input signal for entering into said storage means a signal representing the time interval between the triggering points in the two most recently received cycles, said entering means including means disabling entry of said interval representing signal when said interval of time does not fall within said normal window.

13. The combination of claim 11 further including a duration timer for detecting the initiation and termination of each note, comprising:

a threshold voltage source having an output terminal normally providing a first threshold voltage, said source being actuable to provide a second threshold voltage in place of said first threshold voltage which is lower in amplitude than the first threshold voltage;

means actuated when the envelope of said note exceeds said first threshold voltage for actuating said threshold voltage source.

14. The combination of claim 12 further including a duration timer for detecting the initiation and termination of each note, comprising:

a threshold voltage source having an output terminal normally providing a first threshold voltage, said source being actuable to provide a second threshold voltage in place of said first threshold voltage which is lower in amplitude than the first threshold voltage;

means actuated when the envelope of said note exceeds said first threshold voltage for actuating said threshold voltage source.

15. A transition detector responsive to an input signal having a time-variable envelope representing a sound produced by a musical instrument for generating a binary signal in which each cycle has a period that is substantially equal to that of the corresponding cycle in said input signal, said transition detector comprising:

a source of an adaptive, time variable threshold voltage proportional to the envelope of said input signal and substantially lower in magnitude than the peak thereof; and means for generating a binary signal having a triggering edge coincident with each crossing of said input signal through said threshold level in a predefined direction.

16. A transition detector responsive to an input signal having a time-variable envelope representing a sound produced by a musical instrument for generating a binary signal in which each cycle has a period that is substantially equal to that of the corresponding cycle in said input signal, said transition detector comprising:

a source of an adaptive, time-variable threshold voltage proportional to the envelope of said input signal and substantially lower in magnitude than the peak thereof;

means for generating a binary signal having a triggering edge coincident with each crossing of said input signal through said threshold level in a predefined direction, wherein said triggering edge is the leading edge of said binary signal and is produced on the positive crossing of said input signal;

a source of a second threshold level approximately equal to the average amplitude of said input signal; and means in said generating means responsive to the crossing of said input signal through said second threshold level in a negative direction for producing a negative transition for said binary signal.

17. In combination with the transition detector of claim 15 or 16, apparatus for estimating the period of said input signal, comprising:

means for storing a period estimate;

means for measuring the duration between said triggering edges in consecutive cycles of said binary signal;

means for generating first and second threshold signals each having a value which is a different predetermined proportion of said stored period estimate, said threshold signals defining a variable normal window therebetween; and means actuated when a triggering edge occurs in a newly received cycle of said binary signal for entering into said storage means a signal representing the time interval between the triggering edges in the two most recently received cycles, said entering means including means disabling entry of said interval representing signal when said interval of time does not fall within said normal window.

18. A transition detector responsive to an input signal having a time-variable envelope representing a sound produced by a musical instrument for generating a binary signal in which each cycle has a period that is substantially equal to that of the corresponding cycle in said input signal, said transition detector comprising:

a source of an adaptive threshold voltage proportional to the envelope of said input signal;

means for generating a binary signal having a triggering edge coincident with each crossing of said input signal through said threshold level in a predefined direction, means for storing a period estimate;

means for measuring the duration between said triggering edges in consecutive cycles of said binary signal;

means for generating first and second threshold signals each having a value which is a different predetermined proportion of said stored period estimate, said threshold signals defining a variable normal window therebetween;

means actuated when a triggering edge occurs in a newly received cycle of said binary signal for entering into said storage means a signal representing the time interval between the triggering edges in the two most recently received cycles, said entering means including means disabling entry of said interval representing signal when said interval of time does not fall within said normal window;

a threshold voltage source having an output terminal normally providing a first threshold voltage, said source being actuable to provide a second threshold voltage in place of said first threshold voltage which is lower in amplitude than the first threshold voltage;

means actuated when the envelope of said said input signal exceeds said first threshold voltage for actuating said threshold voltage source; and means jointly responsive to said input signal and said threshold voltage source for indicating the presence of said sound only when said input signal exceeds in amplitude the signal at the output terminal of said threshold voltage source.

19. The combination of claim 17 further comprising:

means for detecting the occurrence of a predetermined number of consecutive cycles wherein said time interval is outside said normal window; and means responsive to said consecutive cycle detecting means for overriding said entry disabling means.

20. Apparatus in accordance with claim 19 further comprising an initializer actuated for a predetermined number of cycles of said input signal immediately following the initiation of a note for overriding said disabling means.

21. Apparatus for estimating the period of an analog input signal representing musical notes each having any of a plurality of distinct starting time, comprising:

means for storing a period estimate;

means for measuring the duration between predefined triggering points in each cycle of said input signal;

means for generting first and second threshold signals each having a value which is a different predetermined proportion of said stored period estimate, said threshold signals defining a variable normal window therebetween; and means actuated when said triggering point occurs in a newly received cycle of said input signal for entering into said storage means a signal representing the time interval between the triggering points in the two most recently received cycles, said entering means including means disabling entry of said interval representing signal when said interval of time does not fall within said normal window.

22. Apparatus in accordance with claim 21 further comprising:

means for detecting the occurrence of a predetermined number of consecutive cycles wherein said time interval is outside said normal window; and means responsive to said consecutive cycle detecting means for overriding said entry disabling means.

23. Apparatus in accordance with any of claims 21 or 22 further comprising an initializer actuated for a predetermined number of cycles of said input signal immediately following the initiation of a note for overriding said disabling means.

24. Apparatus for estimating the period of an analog input signal representing musical notes each having a distinct starting time, comprising:

means for storing a period estimate;

means for measuring the duration between predefined triggering points in each cycle of said input signal;

means for generating first and second threshold signals each having a value which is a different predetermined proportion of said stored period estimate, said threshold signals defining a variable normal window therebetween;

means actuated when said triggering point occurs in a newly received cycle of said input signal for entering into said storage means a signal representing the time interval between the triggering points in the two most recently received cycles, said entering means including means disabling entry of said interval representing signal when said interval of time does not fall within said normal window;

a threshold voltage source having an output terminal normally providing a first threshold voltage, said source being actuable to provide a second threshold voltage in place of said first threshold voltage which is lower an amplitude then the first threshold voltage;

means actuated when the envelope of said note exceeds said first threshold voltage for actuating said threshold voltage source; and means jointly responsive to said input signal and said threshold voltage source for indicating the presence of said sound only when said input signal exceeds in amplitude the signal at the output terminal of said threshold voltage source.

25. Apparatus for estimating the period of an analog input signal representing musical notes each having a distinct starting time and a time-variable envelope, comprising:

means for storing a period estimate;

means for measuring the duration between predefined triggering points in each cycle of said input signal;

means for generating first and second threshold signals each having a value which is a different predetermined proportion of said stored period estimate, said threshold signals defining a variable normal window therebetween;

means actuated when said triggering point occurs in a newly received cycle of said input signal for entering into said storage means a signal representing the time interval between the triggering points in the two most recently received cycles, said entering means including means disabling entry of said interval representing signal when said interval of time does not fall within said normal window;

an initializer actuated for a predetermined number of cycles of said input signal immediately following the initiation of a note for overriding said disabling means;

a threshold voltage source having an output terminal normally providing a first threshold voltage, said source being actuable to provide a second threshold voltage in place of said first threshold voltage which is lower in amplitude than the first threshold voltage;

means actuated when the envelope of said note exceeds said first threshold voltage for actuating said threshold voltage source; and means jointly responsive to said input signal and said threshold voltage source for indicating the presence of said sound only when said input signal exceeds in amplitude the signal at the output terminal of said threshold voltage source.

26. In an apparatus including a pitch detector for providing an output signal estimating the pitch of an analog input signal representing musical notes each having a time-variable envelope and predefined time of initialization, a duration timer for detecting the initiation and termination of each note, comprising:

a threshold voltage source having an output terminal normally providing a first threshold voltage, said source being actuable to provide a second threshold voltage in place of said first threshold voltage which is lower in amplitude than the first threshold voltage and independent thereof in amplitude;

means actuated when the envelope of said note exceeds said first threshold voltage for actuating said threshold voltage source;

the initiation of a note being detected when said envelope crosses said threshold voltage source output signal in a positive going direction and the termination being detected when it crosses the same in a negative going direction.

27. In an apparatus including a pitch detector for providing an output signal estimating the pitch of an analog input signal representing musical notes each having a time-variable envelope and predefined time of initialization, a duration timer for detecting the initiation and termination of each note, comprising:

a threshold voltage source having an output terminal normally providing a first threshold voltage, said source being actuable to provide a second threshold voltage in place of said first threshold voltage which is lower in amplitude than the first threshold voltage and independent thereof in amplitude, wherein said threshold voltage source comprises:

a plurality of serially connected resistors including a junction between two of said resistors at which the voltage provided at the output terminal is present;

normally open switching means connected to shunt at least one of said resistors, said switching means being actuable to produce a low impedance across said shunted resistor; and means for actuating said switching means when said indicating means indicates the presence of said note;

means actuated when the envelope of said note exceeds said first threshold voltage for actuating said threshold voltage source;

the initiation of a note being detected when said envelope crosses said threshold voltage source output signal in a positive going direction and the termination being detected when it crosses the same in a negative going direction.

28. Apparatus for simultaneously estimating the period of a plurality of analog input signals each representing musical notes, comprising:

means defining a plurality of time slots during each of which the apparatus is dedicated to estimating the period of a respective input signal;

means for storing a period estimate for each input signal in a respective storage location;

means for measuring the duration between predefined triggering points in each cycle of each input signal during the respective time slot;

means for generating, during each time slot, first and second threshold signals each having a value which is a different predetermined proportion of said period estimate stored for the respective input signal, said threshold signals defining a respective variable normal window therebetween; and means, actuated during the respective time slot when said triggering point occurs in a newly received cycle of an input signal, for entering into the respective storage location a signal representing the time interval between the triggering points in the two most recently received cycles of said input signal, said entering means including means disabling entry of said interval representing signal when said interval of time does not fall within said normal window.

29. A method for eliminating interference between a plurality of sensors, each providing an electrical signal representing a respective received musical sound with a time-variable envelope, each sensor being dedicated to a different sound source, but also being capable of actuation by other sound sources, said method comprising the steps of:

detecting the envelope representing the build-up of sound from each source; and accepting as an output signal the electrical signal of only that sensor dedicated to the source having the fastest build in its envelope.

30. The method of claim 29 wherein said accepting step includes the steps of:

sensing the rate of build-up of an envelope only after the rate exceeds a threshold value; and comparing the rate of envelope build-up for groups of signals including at least two of said electrical signals and eliminating from acceptance all signals which do not have the fastest envelope build in each group.

31. A method for obtaining reference points, each in a substantially fixed relationship to a cycle of an electrical signal with a time-variable envelope representing a musical sound, said points being useful for determining the pitch of said sound by estimating the time interval between successive reference points, said method comprising the steps of:

generating a threshold signal which is proportional to the envelope of said electrical signal but substantially lower in magnitude than the peak thereof; and detecting a primary reference point whenever said electrical signal crosses said threshold signal in a predetermined direction.

32. A method for obtaining reference points, each in a substantially fixed relationship to a cycle of an electrical signal with a time-variable envelope representing a musical sound, said points being useful for determining the pitch of said sound by estimating the time interval between successive reference points, said method comprising the steps of:

generating an adaptive, time-variable threshold signal which is proportional to the envelope of said electrical signal but substantially lower in magnitude than the peak thereof;

detecting a primary reference point whenever said electrical signal crosses said threshold signal in a predetermined direction; and detecting a secondary reference point whenever said electrical signal crosses a predefined voltage amplitude, different from said threshold signal and approximately equal to the average amplitude of said input signal, in the direction opposite said predetermined direction;

producing a binary signal having opposite transitions coincident with primary and secondary reference points; and selecting transitions of the same sense in said binary signal as the points between which the interval is to be measured.

33. A method for estimating the period of an analog input signal representing musical notes each having a distinct starting time, said estimating being accomplished by operating on a timing signal having triggering points occuring at a predefined point in each cycle of said input signal, said method comprising the steps of:

for an initialization period comprising at least one cycle of said input signal subsequent to the start of a note, setting the period estimate equal to the time interval between the two most recent triggering points;

after said initialization period, generating first and second threshold levels each being a predetermined proportion of said period estimate, said threshold levels defining a variable normal window therebetween;

updating the period estimate to be equal to the interval between the two most recent trigger points only when that interval lies within said normal window.

34. The method of claim 33 further comprising the steps of:

counting the number of consecutive cycles of said input in which the interval between consecutive triggering points lies outside said normal window; and updating the period estimate to be equal to the most recent interval when it is the last of a predetermined number of intervals lying outside said normal window.

35. The method of claim 33 or 34 wherein said triggering points are obtained by:

generating a threshold signal which is proportional to the envelope of said input signal; and producing a triggering point whenever said electrical signal crosses said threshold signal in a predetermined direction.

36. The method of claim 35 further comprising the steps of:

detecting a secondary triggering point whenever said electrical signal crosses a predefined voltage amplitude different from said threshold signal in the direction opposite said predetermined direction;

producing a binary signal having oppositely directed transitions coincident with triggering points and secondary triggering points; and selecting consecutive transitions of the same direction in said binary signal as the triggering points between which the interval is to be measured.

37. In an apparatus including a pitch detector for providing an output signal estimating the pitch of an analog input signal representing musical notes each having a predefined time of initialization, a method for detecting the initiation and termination of each note, comprising the steps of:

generating a threshold signal normally having a first value;

detecting the envelope of the input signal;

comparing the input signal envelope to the threshold signal;

detecting the initiation of a note when the input signal envelope first exceeds the threshold signal and setting the threshold signal to a second value lower than the first value and independent thereof;

detecting the termination of a note when the envelope first falls below the threshold signal and setting the threshold equal to the first valve.

38. A method for simultaneously estimating the period of a plurality of analog signals each representing musical notes having distinct times, said estimating being accomplished by operating on a timing signal for each analog signal having triggering points occuring at a predefined point in each cycle of said analog signal, said method comprising the steps of:

sequentially and repetitively sampling said analog signals, the time of sampling each signal defining a respective time slot dedicated thereto;

for an initialization period comprising at least one cycle of an analog signal subsequently to the start of the respective note, during the respective time slot, setting the period estimate for the time slot equal to the time interval between the two most recent triggering points for that analog signal;

after said initialization period, during each time slot, generating first and second threshold levels each being a predetermined proportion of the period estimate for the time slot, said threshold levels defining a normal window therebetween; and during each time slot, updating the period estimate therefor to be equal to the interval between the two most recent trigger points for the respective analog signal only when that interval lies within the normal window for the time slot.

39. The method of claim 38 further comprising the steps of:

during each time slot, counting the number of consecutive cycles of the respective analog signal in which the interval between consecutive triggering points lies outside the normal window for the time slot; and in each time slot, updating the period estimate for the time slot to be equal to the most recent interval for the respective analog signal when it is the last of a predetermined number of intervals for the respective analog signal lying outside said normal window for the time slot.

40. A transition detector according to claim 18 wherein said triggering edge is the leading edge of said binary signal and is produced on the positive crossing of said input signal, said transistion detector further comprising a source of a second threshold level, and means in said generating means response to the crossing of said input signal through said second threshold level in a negative direction for producing a negative transition for said binary signal.

41. The combination of claim 18 or 40 further comprising:

means for detecting the occurrence of a predetermined number of consecutive cycles wherein said time interval is outside said normal window; and means responsive to said consecutive cycle detecting means for overriding said entry disabling means.

42. Apparatus in accordance with claim 41 further comprising an initializer actuated for a predetermined number of cycles of said input signal immediately following the initiation of a note for overriding said disabling means.

43. Apparatus in accordance with claim 24 further comprising:

means for detecting the occurrence of a predetermined number of consecutive cycles wherein said time interval is outside said normal window; and means responsive to said consecutive cycle detecting means for overriding said entry disabling means.

44. Apparatus in accordance with claim 25 further comprising:

means for detecting the occurrence of a predetermined number of consecutive cycles wherein said time interval is outside said normal window; and means responsive to said consecutive cycle detecting means for overriding said entry disabling means.

* * * * *